US008847279B2

(12) United States Patent  
Bai et al.

(10) Patent No.: US 8,847,279 B2
(45) Date of Patent: Sep. 30, 2014

(54) DEFECT REDUCTION USING ASPECT RATIO TRAPPING

(75) Inventors: Jie Bai, Salem, NH (US); Ji-Soo Park, Methuen, MA (US); Anthony J. Lochtefeld, Ipswich, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 22 days.

(21) Appl. No.: 13/446,612

(22) Filed: Apr. 13, 2012

(65) Prior Publication Data

US 2012/0199876 A1 Aug. 9, 2012

Related U.S. Application Data

(62) Division of application No. 11/852,078, filed on Sep. 7, 2007, now Pat. No. 8,173,551.

(60) Provisional application No. 60/873,903, filed on Dec. 8, 2006, provisional application No. 60/842,771, filed on Sep. 7, 2006.

(51) Int. Cl.
*H01L 21/02* (2006.01)
*C30B 25/18* (2006.01)
*C30B 29/48* (2006.01)
*C30B 29/40* (2006.01)

(52) U.S. Cl.
CPC ........ *C30B 25/183* (2013.01); *H01L 21/02521* (2013.01); *H01L 21/02647* (2013.01); *H01L 21/02532* (2013.01); *H01L 21/02381* (2013.01); *H01L 21/02639* (2013.01); *C30B 29/48* (2013.01); *C30B 29/40* (2013.01)

USPC .................................... 257/190; 257/E29.024

(58) Field of Classification Search
USPC .......................................... 257/190, E29.024
See application file for complete search history.

(56) References Cited

U.S. PATENT DOCUMENTS

| | | |
|---|---|---|
| 4,307,510 A | 12/1981 | Sawyer et al. |
| 4,322,253 A | 3/1982 | Pankove et al. |
| 4,370,510 A | 1/1983 | Stirn |
| 4,545,109 A | 10/1985 | Reichert |
| 4,551,394 A | 11/1985 | Betsch et al. |
| 4,651,179 A | 3/1987 | Reichert |
| 4,727,047 A | 2/1988 | Bozler et al. |
| 4,774,205 A | 9/1988 | Choi et al. |
| 4,789,643 A | 12/1988 | Kajikawa |
| 4,826,784 A | 5/1989 | Salerno et al. |

(Continued)

FOREIGN PATENT DOCUMENTS

| | | |
|---|---|---|
| CN | 2550906 | 5/2003 |
| DE | 10017137 | 10/2000 |

(Continued)

OTHER PUBLICATIONS

Ng, "Resonant-Tunneling Diode," Complete Guide to Semiconductor Devices, Chapter 10. Nov. 3, 2010, pp. 75-83.

(Continued)

*Primary Examiner* — Matthew Reames
(74) *Attorney, Agent, or Firm* — Slater and Matsil, L.L.P.

(57) ABSTRACT

Lattice-mismatched epitaxial films formed proximate non-crystalline sidewalls. Embodiments of the invention include formation of facets that direct dislocations in the films to the sidewalls.

20 Claims, 15 Drawing Sheets

(56) References Cited

U.S. PATENT DOCUMENTS

| | | |
|---|---|---|
| 4,860,081 A | 8/1989 | Cogan |
| 4,876,210 A | 10/1989 | Barnett et al. |
| 4,948,456 A | 8/1990 | Schubert |
| 4,963,508 A | 10/1990 | Umeno et al. |
| 5,032,893 A | 7/1991 | Fitzgerald, Jr. et al. |
| 5,034,337 A | 7/1991 | Mosher et al. |
| 5,061,644 A | 10/1991 | Yue et al. |
| 5,079,616 A | 1/1992 | Yacobi et al. |
| 5,091,333 A | 2/1992 | Fan et al. |
| 5,091,767 A | 2/1992 | Bean et al. |
| 5,093,699 A | 3/1992 | Weichold et al. |
| 5,098,850 A | 3/1992 | Nishida et al. |
| 5,105,247 A | 4/1992 | Cavanaugh |
| 5,108,947 A | 4/1992 | Demeester et al. |
| 5,156,995 A | 10/1992 | Fitzgerald, Jr. et al. |
| 5,159,413 A | 10/1992 | Calviello et al. |
| 5,164,359 A | 11/1992 | Calviello et al. |
| 5,166,767 A | 11/1992 | Kapoor et al. |
| 5,223,043 A | 6/1993 | Olson et al. |
| 5,236,546 A | 8/1993 | Mizutani |
| 5,238,869 A | 8/1993 | Shichijo et al. |
| 5,256,594 A | 10/1993 | Wu et al. |
| 5,269,852 A | 12/1993 | Nishida |
| 5,269,876 A | 12/1993 | Mizutani |
| 5,272,105 A | 12/1993 | Yacobi et al. |
| 5,281,283 A | 1/1994 | Tokunaga et al. |
| 5,285,086 A | 2/1994 | Fitzgerald, Jr. |
| 5,295,150 A | 3/1994 | Vangieson et al. |
| 5,356,831 A | 10/1994 | Calviello et al. |
| 5,403,751 A | 4/1995 | Nishida et al. |
| 5,405,453 A | 4/1995 | Ho et al. |
| 5,407,491 A | 4/1995 | Freundlich et al. |
| 5,410,167 A | 4/1995 | Saito |
| 5,417,180 A | 5/1995 | Nakamura |
| 5,427,976 A | 6/1995 | Koh et al. |
| 5,432,120 A | 7/1995 | Meister et al. |
| 5,438,018 A | 8/1995 | Mori et al. |
| 5,461,243 A | 10/1995 | Ek et al. |
| 5,518,953 A | 5/1996 | Takasu |
| 5,528,209 A | 6/1996 | MacDonald et al. |
| 5,545,586 A | 8/1996 | Koh |
| 5,548,129 A | 8/1996 | Kubena |
| 5,589,696 A | 12/1996 | Baba |
| 5,621,227 A | 4/1997 | Joshi |
| 5,622,891 A | 4/1997 | Saito |
| 5,640,022 A | 6/1997 | Inai |
| 5,710,436 A | 1/1998 | Tanamoto et al. |
| 5,717,709 A | 2/1998 | Sasaki et al. |
| 5,792,679 A | 8/1998 | Nakato |
| 5,825,049 A | 10/1998 | Simmons et al. |
| 5,825,240 A | 10/1998 | Geis et al. |
| 5,849,077 A | 12/1998 | Kenney |
| 5,853,497 A | 12/1998 | Lillington et al. |
| 5,869,845 A | 2/1999 | Vander Wagt et al. |
| 5,883,549 A | 3/1999 | De Los Santos |
| 5,886,385 A | 3/1999 | Arisumi et al. |
| 5,903,170 A | 5/1999 | Kulkarni et al. |
| 5,953,361 A | 9/1999 | Borchert et al. |
| 5,959,308 A | 9/1999 | Shichijo et al. |
| 5,966,620 A | 10/1999 | Sakaguchi et al. |
| 5,998,781 A | 12/1999 | Vawter et al. |
| 6,011,271 A | 1/2000 | Sakuma et al. |
| 6,015,979 A | 1/2000 | Sugiura et al. |
| 6,049,098 A | 4/2000 | Sato |
| 6,083,598 A | 7/2000 | Ohkubo et al. |
| 6,100,106 A | 8/2000 | Yamaguchi et al. |
| 6,110,813 A | 8/2000 | Ota et al. |
| 6,111,288 A | 8/2000 | Watanabe et al. |
| 6,121,542 A | 9/2000 | Shiotsuka et al. |
| 6,150,242 A | 11/2000 | Van de Wagt et al. |
| 6,153,010 A | 11/2000 | Kiyoku et al. |
| 6,191,432 B1 | 2/2001 | Sugiyama et al. |
| 6,225,650 B1 | 5/2001 | Tadatomo et al. |
| 6,228,691 B1 | 5/2001 | Doyle |
| 6,229,153 B1 | 5/2001 | Botez et al. |
| 6,235,547 B1 | 5/2001 | Sakuma et al. |
| 6,252,261 B1 | 6/2001 | Usui et al. |
| 6,252,287 B1 | 6/2001 | Kurtz et al. |
| 6,271,551 B1 | 8/2001 | Schmitz et al. |
| 6,274,889 B1 | 8/2001 | Ota et al. |
| 6,300,650 B1 | 10/2001 | Sato |
| 6,320,220 B1 | 11/2001 | Watanabe et al. |
| 6,325,850 B1 | 12/2001 | Beaumont et al. |
| 6,339,232 B1 | 1/2002 | Takagi |
| 6,342,404 B1 | 1/2002 | Shibata et al. |
| 6,348,096 B1 | 2/2002 | Sunakawa et al. |
| 6,352,942 B1 | 3/2002 | Luan et al. |
| 6,362,071 B1 | 3/2002 | Nguyen et al. |
| 6,380,051 B1 | 4/2002 | Yuasa et al. |
| 6,380,590 B1 | 4/2002 | Yu |
| 6,403,451 B1 | 6/2002 | Linthicum et al. |
| 6,407,425 B1 | 6/2002 | Babcock et al. |
| 6,456,214 B1 | 9/2002 | van de Wagt |
| 6,458,614 B1 | 10/2002 | Nanishi et al. |
| 6,475,869 B1 | 11/2002 | Yu |
| 6,492,216 B1 | 12/2002 | Yeo et al. |
| 6,500,257 B1 | 12/2002 | Wang et al. |
| 6,503,610 B2 | 1/2003 | Hiramatsu et al. |
| 6,512,252 B1 | 1/2003 | Takagi et al. |
| 6,521,514 B1 | 2/2003 | Gehrke et al. |
| 6,552,259 B1 | 4/2003 | Hosomi et al. |
| 6,566,284 B2 | 5/2003 | Thomas, III et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,606,335 B1 | 8/2003 | Kuramata et al. |
| 6,617,643 B1 | 9/2003 | Goodwin-Johansson |
| 6,635,110 B1 | 10/2003 | Luan et al. |
| 6,645,295 B1 | 11/2003 | Koike et al. |
| 6,645,797 B1 | 11/2003 | Buynoski et al. |
| 6,686,245 B1 | 2/2004 | Mathew et al. |
| 6,703,253 B2 | 3/2004 | Koide |
| 6,709,982 B1 | 3/2004 | Buynoski et al. |
| 6,710,368 B2 | 3/2004 | Fisher et al. |
| 6,720,196 B2 | 4/2004 | Kunisato et al. |
| 6,727,523 B2 | 4/2004 | Morita |
| 6,753,555 B2 | 6/2004 | Takagi et al. |
| 6,756,611 B2 | 6/2004 | Kiyoku et al. |
| 6,762,483 B1 | 7/2004 | Krivokapic et al. |
| 6,767,793 B2 | 7/2004 | Clark et al. |
| 6,784,074 B2 | 8/2004 | Shchukin et al. |
| 6,787,864 B2 | 9/2004 | Paton et al. |
| 6,794,718 B2 | 9/2004 | Nowak et al. |
| 6,800,910 B2 | 10/2004 | Lin et al. |
| 6,803,598 B1 | 10/2004 | Berger et al. |
| 6,809,351 B2 | 10/2004 | Kuramoto et al. |
| 6,812,053 B1 | 11/2004 | Kong et al. |
| 6,812,495 B2 | 11/2004 | Wada et al. |
| 6,815,241 B2 | 11/2004 | Wang |
| 6,815,738 B2 | 11/2004 | Rim |
| 6,825,534 B2 | 11/2004 | Chen et al. |
| 6,831,350 B1 | 12/2004 | Liu et al. |
| 6,835,246 B2 | 12/2004 | Zaidi |
| 6,835,618 B1 | 12/2004 | Dakshina-Murthy et al. |
| 6,838,322 B2 | 1/2005 | Pham et al. |
| 6,841,410 B2 | 1/2005 | Sasaoka |
| 6,841,808 B2 | 1/2005 | Shibata et al. |
| 6,849,077 B2 | 2/2005 | Ricci |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,882,051 B2 | 4/2005 | Majumdar et al. |
| 6,887,773 B2 | 5/2005 | Gunn, III et al. |
| 6,888,181 B1 | 5/2005 | Liao et al. |
| 6,900,070 B2 | 5/2005 | Craven et al. |
| 6,900,502 B2 | 5/2005 | Ge et al. |
| 6,902,965 B2 | 6/2005 | Ge et al. |
| 6,902,991 B2 | 6/2005 | Xiang et al. |
| 6,909,186 B2 | 6/2005 | Chu |
| 6,917,068 B1 | 7/2005 | Krivokapic |

(56) References Cited

U.S. PATENT DOCUMENTS

| | | |
|---|---|---|
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,951,819 B2 | 10/2005 | Iles et al. |
| 6,955,969 B2 | 10/2005 | Djomehri et al. |
| 6,955,977 B2 | 10/2005 | Kong et al. |
| 6,958,254 B2 | 10/2005 | Seifert |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,045,401 B2 | 5/2006 | Lee et al. |
| 7,049,627 B2 | 5/2006 | Vineis et al. |
| 7,061,065 B2 | 6/2006 | Horng et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,088,143 B2 | 8/2006 | Ding et al. |
| 7,091,561 B2 | 8/2006 | Matsushita et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,145,167 B1 | 12/2006 | Chu |
| 7,154,118 B2 | 12/2006 | Lindert et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,179,727 B2 | 2/2007 | Capewell et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,217,882 B2 | 5/2007 | Walukiewicz et al. |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,297,569 B2 | 11/2007 | Bude et al. |
| 7,344,942 B2 | 3/2008 | Korber |
| 7,361,576 B2 | 4/2008 | Imer et al. |
| 7,372,066 B2 | 5/2008 | Sato et al. |
| 7,420,201 B2 | 9/2008 | Langdo et al. |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,638,842 B2 | 12/2009 | Currie et al. |
| 7,655,960 B2 | 2/2010 | Nakahata et al. |
| 7,777,250 B2 | 8/2010 | Lochtefeld |
| 7,799,592 B2 | 9/2010 | Lochtefeld |
| 7,825,328 B2 | 11/2010 | Li |
| 7,875,958 B2 | 1/2011 | Cheng et al. |
| 8,034,697 B2 | 10/2011 | Fiorenza et al. |
| 2001/0006249 A1 | 7/2001 | Fitzgerald |
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1 | 4/2002 | Kiyoku et al. |
| 2002/0047155 A1 | 4/2002 | Babcock et al. |
| 2002/0066403 A1 | 6/2002 | Sunakawa et al. |
| 2002/0070383 A1 | 6/2002 | Shibata et al. |
| 2002/0084000 A1 | 7/2002 | Fitzgerald |
| 2002/0127427 A1 | 9/2002 | Young et al. |
| 2002/0168802 A1 | 11/2002 | Hsu et al. |
| 2002/0168844 A1 | 11/2002 | Kuramoto et al. |
| 2002/0179005 A1 | 12/2002 | Koike et al. |
| 2003/0030117 A1 | 2/2003 | Iwasaki et al. |
| 2003/0045017 A1 | 3/2003 | Hiramatsu et al. |
| 2003/0057486 A1 | 3/2003 | Gambino et al. |
| 2003/0064535 A1 | 4/2003 | Kub et al. |
| 2003/0070707 A1 | 4/2003 | King et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0118451 A1 | 6/2004 | Walukiewicz et al. |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1 | 8/2004 | Narui et al. |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0195624 A1 | 10/2004 | Liu et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |

(56) References Cited

U.S. PATENT DOCUMENTS

| | | |
|---|---|---|
| 2005/0009304 A1 | 1/2005 | Zheleva et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han et al. |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1 | 3/2006 | Bude et al. |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |
| 2006/0267047 A1 | 11/2006 | Murayama |
| 2006/0272572 A1* | 12/2006 | Uematsu et al. ............... 117/84 |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0154197 A1 | 6/2008 | Derrico et al. |
| 2008/0187018 A1 | 8/2008 | Li |
| 2008/0194078 A1 | 8/2008 | Akiyama et al. |
| 2008/0245400 A1 | 10/2008 | Li |
| 2008/0257409 A1 | 10/2008 | Li et al. |
| 2008/0286957 A1 | 11/2008 | Lee et al. |
| 2009/0039361 A1 | 2/2009 | Li et al. |
| 2009/0042344 A1 | 2/2009 | Ye et al. |
| 2009/0065047 A1 | 3/2009 | Fiorenza et al. |
| 2009/0072284 A1 | 3/2009 | King et al. |
| 2009/0110898 A1 | 4/2009 | Levy et al. |
| 2009/0321882 A1 | 12/2009 | Park |
| 2010/0012976 A1 | 1/2010 | Hydrick et al. |
| 2010/0025683 A1 | 2/2010 | Cheng |
| 2010/0072515 A1 | 3/2010 | Park et al. |
| 2010/0078680 A1 | 4/2010 | Cheng et al. |
| 2010/0176371 A1 | 7/2010 | Lochtefeld |
| 2010/0176375 A1 | 7/2010 | Lochtefeld |
| 2010/0213511 A1 | 8/2010 | Lochtefeld |
| 2010/0216277 A1 | 8/2010 | Fiorenza et al. |
| 2010/0252851 A1 | 10/2010 | Emerson et al. |
| 2010/0308376 A1 | 12/2010 | Takada et al. |
| 2011/0011438 A1 | 1/2011 | Li |
| 2011/0049568 A1 | 3/2011 | Lochtefeld et al. |
| 2011/0086498 A1 | 4/2011 | Cheng et al. |

FOREIGN PATENT DOCUMENTS

| | | |
|---|---|---|
| DE | 10320160 | 8/2004 |
| EP | 0352472 | 6/1989 |
| EP | 0600276 | 6/1994 |
| EP | 0817096 | 1/1998 |
| EP | 1551063 | 7/2005 |
| EP | 1796180 | 6/2007 |
| GB | 2215514 | 9/1989 |
| JP | 2-62090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004200375 | 7/2004 |
| JP | 2009177167 | 8/2009 |
| KR | 20030065631 | 8/2003 |
| KR | 20090010284 | 1/2009 |
| TW | 544930 | 8/2003 |
| WO | WO0072383 | 11/2000 |
| WO | WO0101465 | 1/2001 |
| WO | WO0209187 | 1/2002 |

(56) References Cited

FOREIGN PATENT DOCUMENTS

| WO | WO02086952 | 10/2002 |
|---|---|---|
| WO | WO02088834 | 11/2002 |
| WO | WO03073517 | 9/2003 |
| WO | WO2004004927 | 1/2004 |
| WO | WO2004023536 | 3/2004 |
| WO | WO2005013375 | 2/2005 |
| WO | WO2005048330 | 5/2005 |
| WO | WO2005098963 | 10/2005 |
| WO | WO2005122267 | 12/2005 |
| WO | WO2006025407 | 3/2006 |
| WO | WO2006125040 | 11/2006 |
| WO | WO2008124154 | 10/2008 |

OTHER PUBLICATIONS

"Communication pursuant to Article 94(3) EPC," Application No. 06 770 525.1-2203, Applicant: Taiwan Semiconductor Company, Ltd., Feb. 17, 2011, 4 pages.
68 Applied Physics Letters 7, 1999, pp. 774-779 (trans. of relevant portions attached).
Ames, "Intel Says More Efficient Chips are Coming," PC World, available at: http://www.pcworld.com/printable/article/id,126044/printable.html (Jun. 12, 2006); 4 pages.
Asano et al., "AlGaInN laser diodes grown on an ELO-GaN substrate vs. on a sapphire substrate," Semiconductor Laser Conference (2000) Conference Digest, IEEE 17$^{th}$ International, 2000, pp. 109-110.
Asaoka, et al., "Observation of 1 f $^x$/noise of GaInP/GaAs triple barrier resonant tunneling diodes," AIP Conf. Proc., vol. 780, Issue 1, 2005, pp. 492-495.
Ashby, et al., "Low-dislocation-density GaN from a single growth on a textured substrate," Applied Physics Letters, vol. 77, No. 20, Nov. 13, 2000, pp. 3233-3235.
Ashley, et al., "Heterogeneous InSb Quantum Well Transistors on Silicon for Ultra-High Speed, Low Power Logic Applications," 43 Electronics Letters 14, Jul. 2007, 2 pages.
Bai et al., "Study of the Defect Elimination Mechanisms in Aspect Ratio Trapping Ge Growth," Applied Physics Letters, vol. 90, 2007, 3 pages.
Bakkers et al., "Epitaxial Growth on InP Nanowires on Germanium," Nature Materials, vol. 3, Nov. 2004, pp. 769-773.
Baron et al., "Chemical Vapor Deposition of Ge Nanocrystals on $SiO_2$," Applied Physics Letters, vol. 83, No. 7, Aug. 18, 2003, pp. 1444-1446.
Bean et al., "$Ge_xSi_{1-x}$/Si strained-later Superlattice grown by molecular beam Epitaxy," Journal of Vacuum Science Technology A2 (2), Jun. 1984, pp. 436-440.
Beckett et al., "Towards a reconfigurable nanocomputer platform," ACM International Conference Proceeding Series, vol. 19, 2002, pp. 141-150.
Beltz et al., "A Theoretical Model for Threading Dislocation Reduction During Selective Area Growth," Materials Science and Engineering, A234-236, 1997, pp. 794-797.
Belyaev, et al., "Resonance and current instabilities in Aln/GaN resonant tunneling diodes," 21 Physica E 2-4, 2004, pp. 752-755.
Berg, J., "Electrical Characterization of Silicon Nanogaps," Doktorsavhandlingar vid Chalmers Tekniska Hagskola, 2005, No. 2355, 2 pages.
Bergman et al., "RTD/CMOS Nanoelectronic Circuits: Thin-Film InP-based Resonant Tunneling Diodes Integrated with CMOS circuits," 20 Electron Device Letters 3, 1999, pp. 119-122.
Blakeslee, "The Use of Superlattices to Block the Propagation of Dislocations in Semiconductors," Mat. Res. Soc. Symposium Proceedings 148, 1989, pp. 217-227.
Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.
Borland, "Novel Device structures by selective epitaxial growth (SEG)," Electron Devices Meeting, vol. 33, 1987, pp. 12-15.

Bryskiewicz, "Dislocation filtering in SiGe and InGaAs buffer layers grown by selective lateral overgrowth method," Applied Physics Letters, vol. 66, No. 10, Mar. 6, 1995, pp. 1237-1239.
Burenkov et al., "Corner Effect in Double and Triple Gate FinFETs" European solid-state device research, 33rd Conference on Essderc '03 Sep. 16-18, 2003, Piscataway, NJ, USA, IEEE, vol. 16, pp. 135-138, XPo10676716.
Bushroa et al., "Lateral epitaxial overgrowth and reduction in defect density of 3C-SiC on patterned Si substrates," Journal of Crystal Growth, vol. 271, No. 1-2, Oct. 15, 2004, pp. 200-206.
Calado, et al., "Modeling of a resonant tunneling diode optical modulator," Univeristy of Algarve, Department of Electronics and Electrical Engineering, 2005, pp. 96-99.
Campo et al., "Comparison of Etching Processes of Silicon and Germanium in SF6-O2 Radio-Frequency Plasma," 13 Journal of Vac. Sci. Tech., B-2, 1995, pp. 235-241.
Cannon et al., "Monolithic Si-based Technology for Optical Receiver Circuits," Proceedings of SPIE, vol. 4999, 2003, pp. 145-155.
Chan et al., "Influence of Metalorganic Sources on the Composition Uniformity of Selectively Grown $Ga_xIn_{1-x}P$," Japan. Journal of Applied Physics, vol. 33, 1994, pp. 4812-4819.
Chang et al. "3-D simulation of strained Si/SiGe heterojunction FinFETs" Semiconductor Device Research Symposium, Dec. 10-12, 2003, pp. 176-177.
Chang et al., "Effect of growth temperature on epitaxial lateral overgrowth of GaAs on Si substrate," Journal of Crystal Growth, vol. 174, No. 1-4, Apr. 1997, pp. 630-634.
Chang et al., "Epitaxial Lateral Overgrowth of Wide Dislocation-Free GaAs on Si Substrates," Electrochemical Society Proceedings, vol. 97-21, May 13, 1998, pp. 196-200.
Chau et al., Opportunities and Challenges of III-V Nanoelectronics for Future High-Speed, Low Power Logic Applications, IEEE CSIC Digest, 2005, pp. 17-20.
Chen et al., "Dislocation reduction in GaN thin films via lateral overgrowth from trenches," Applied Physics Letters, vol. 75, No. 14, Oct. 4, 1999, pp. 2062-2063.
Chengrong, et al., "DBRTD with a high PVCR and a peak current density at room temperature," Chinese Journal of Semiconductors vol. 26, No. 10, Oct. 2005, pp. 1871-1874.
Choi et al., "Monolithic Integration GaAs/AlGaAs LED and Si Driver Circuit," 9 Electron Device Letters 10, Oct. 1988, 3 pages.
Choi et al., "Monolithic Integration of GaAs/AlGaAs Double-Heterostructure LEDs and Si MOSFETs," Electron Device Letters, vol. EDL-7, No. 9, Sep. 1986, 3 pages.
Choi et al., "Monolithic Integration of Si MOSFETs and GaAs MESFETs," Electron Device Letters, vol. EDL-7, No. 4, Apr. 1986, 3 pages.
Choi, et al., "Low-voltage low-power K-band balanced RTD-based MMIC VCO," 2006 IEEE, Department of EECS, Korea Advanced Institute of Science and Technology, 2006, pp. 743-746.
Cloutier et al., "Optical gain and stimulated emission in periodic nanopatterned crystalline silicon," Nature Materials, Nov. 2005, 5 pages.
Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.
Dadgar et al., "MOVPE growth of GaN on Si (111) substrates," Journal of Crystal Growth, vol. 248, Feb. 1, 2003, pp. 556-562.
Datta et al., "Silicon and III-V Nanoelectronics," IEEE International Conference on Indium Phosphide & Related Materials, 2005, pp. 7-8.
Datta et al., "Ultrahigh-Speed 0.5 V Supply Voltage In0.7Ga0.3As Quantum-Well Transistors on Silicon Substrate," 28 Electron Device Letters 8, 2007, pp. 685-687.
Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.
De Boeck et al., "The fabrication on a novel composite $GaAs/SiO_2$ nucleation layer on silicon for heteroepitaxial overgrowth by molecular beam Epitaxy," Material Science and Engineering, B9, 1991, pp. 137-141.
Donaton et al., "Design and Fabrication of MOSFETs with a Reverse Embedded SiGe (Rev. e-SiGe) Structure," 2006 IEDM, pp. 465-468.

(56) References Cited

OTHER PUBLICATIONS

Dong, Y., et al, "Selective area growth of InP through narrow openings by MOCVD and its application to InP HBT," 2003 International Conference on Indium Phosphide and Related Materials, May 12-16, 2003, pp. 389-392.

European Patent Office, Extended European Search Report and Search Opinion dated Jan. 26, 2011 in EP Patent Application No. 10003084.0-2203 (9 pages).

Examination Report in European Patent Application No. 06800414.2, mailed Mar. 5, 2009, 3 pages.

Fang et al., "Electrically pumped hybrid AlGaInAs-silicon evanescent laser," 14 Optics Express 20, 2006, pp. 9203-9210.

Feltin et al., "Epitaxial lateral overgrowth of GaN on Si (111)," Journal of Applied Physics, vol. 93, No. 1, Jan. 1, 2003, pp. 182-185.

Feng et al., "Integration of Germanium-on Insulator and Silicon Substrate," 27 Electron Device Letters 11, 2006, pp. 911-913.

Fiorenza et al., "Film Thickness Constraints for Manufacturable Strained Silicon CMOS," 19 Semiconductor Science Technology, 2004, p. L4.

Fischer et al., "Elastic stress relaxation in SiGe epilayers on patterned Si substrates," 75 Journal of Applied Physics 1, 1994, pp. 657-659.

Fischer et al., "State of stress and critical thickness of Strained small-area SiGe layers," Phys. Stat. Sol. (a) vol. 171, 1999, pp. 475-485.

Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9, 1990, pp. 949-955.

Fitzgerald et al., "Epitaxial Necking in GaAs Growth on Pre-patterned Si Substrates," Journal of Electronic Materials, vol. 20, No. 10, 1991, pp. 839-853.

Fitzgerald et al., "Nucleation Mechanisms and the Elimination of Misfit Dislocations at Mismatched Interfaces by Reduction in Growth Areas," Journal of Applied Physics, vol. 65, No. 6, Mar. 15, 1989, pp. 2220-2237.

Fitzgerald et al., "Structure and recombination in InGaAs/GaAs heterostructures," 63 Journal of Applied Physics, vol. 3, 1988, pp. 693-703.

Fitzgerald et al., "Totally relaxed $Ge_xSi_{1-x}$ layers with low threading dislocation densities grown on Si Substrates," vol. 59, Applied Physics Letters 7, 1991, pp. 811-813.

Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.

Gallagher et al., "Development of the magnetic tunnel junction MRAM at IBM: From first junctions to a 16-Mb MRAM demonstrator chip," 50 IBM J. Research & Dev. 1, Jan. 2006, pp. 5-23A.

Gallas et al., "Influence of Doping on Facet Formation at the $SiO_2$/Si Interface," Surface Sci. 440, 1999, pp. 41-48.

Geppert, "Quantum transistors: toward nanoelectronics," IEEE Spectrum, Sep. 2000, pp. 46-51.

Gibbon et al., "Selective-area low-pressure MOCVD of GaInAsP and related materials on planar InP substrates," Semicond. Sci. Tech. vol. 8, 1993, pp. 998-1010.

Glew et al., "New DFB grating structure using dopant-induced refractive index step," J. Crystal Growth 261, 2004, pp. 349-354.

Golka, et al., "Negative differential resistance in dislocation-free GaN/AlGan double-barrier diodes grown on bulk GaN," 88 Applied Physics Letters 17, Apr. 2006, pp. 172106-1-172106-3.

Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.

Gould et al., "Magnetic resonant tunneling diodes as voltage-controlled spin selectors," 241 Phys. Stat. Sol. (B), vol. 3, 2004, pp. 700-703.

Groenert et al., "Monolithic integration of room-temperature cw GaAs/AlGaAs lasers on Si substrates via relaxed graded GeSi buffer layers," 93 Journal of Applied Physics, No. 362, Jan. 2003, pp. 362-367.

Gruber, et al., "Semimagnetic Resonant Tunneling Diodes for Electron Spin Manipulation," Nanostructures: Physics & Technology, 8th International Symposium, 2000, pp. 483-486.

Gustafsson et al., "Cathodoluminescence from relaxed $Ge_xSi_{1-x}$ grown by heteroepitaxial lateral overgrowth," Journal of Crystal Growth 141, 1994, pp. 363-370.

Gustafsson et al., "Investigations of high quality $Ge_xSi_{1-x}$ grown by heteroepitaxial lateral overgrowth using cathodlouminescence," Inst. Phys. Conf. Ser., No. 134, Section 11, Apr. 1993, pp. 675-678.

Hammerschmidt, "Intel to Use Trigate Transistors from 2009 on," EETIMES Online, available at: http://www.eetimes.com/showArticle.jhtml?articleID=189400035 (Jun. 12, 2006). 1 page.

Hasegawa, et al., "Sensing Terahertz Signals with III-V Quantum Nanostructures," Quantum Sensing: Evolution and Revolution from Past to Future, SPIE 2003, pp. 96-105.

Hayafuji et al., Japan, Journal of Applied Physics, vol. 29, 1990, pp. 2371-2375.

Hersee et al., "The Controlled Growth of GaN Nanowires," Nano Letters, vol. 6, No. 8, 2006, pp. 1808-1811.

Hiramatsu et al., "Fabrication and characterization of low defect density GaN using facet-controlled epitaxial lateral overgrowth (FACELO)," Journal of Crystal Growth, vol. 221, Dec. 2000, pp. 316-326.

Hollander et al., "Strain and Misfit Dislocation Density in Finite Lateral Size $Si_{1-x}Ge_x$/Si Films Grown by Selective Epitaxy," Thin Solid Films, vol. 292, 1997, pp. 213-217.

Hu et al., "Growth of Well-Aligned Carbon Nanotube arrays on Silicon Substrates Using Porous Alumina Film as a Nanotemplate," 79 Applied Physics Letters 19, 2001, 3 pages.

Yanlong, et al., "Monolithically fabricated OEICs using RTD and MSM," Chinese Journal Semiconductors vol. 27, No. 4, Apr. 2006, pp. 641-645.

Huang et al., "Electron and Hole Mobility Enhancement in Strained SOI by Wafer Bonding," 49 IEEE Transactions on Electron Devices 9, 2002, pp. 1566-1570.

Huang, et al., "Resonant tunneling diodes and high electron mobility transistors integrated on GaAs substrates," Chinese Physics Letters 23, vol. 3, Mar. 2006, pp. 697-700.

Intel Press Release, "Intel's Tri-Gate Transistor to Enable Next Era in Energy-Efficient Performance," Intel Corporation (Jun. 12, 2006). 2 pages.

Intel to Develop Tri-Gate Transistors Based Processors, available at: http://news.techwhack.com/3822/tri-gate-transistors/ (Jun. 13, 2006) 6 pages.

International Preliminary Report on Patentability for International Application No. PCT/US2006/019152 mailed Nov. 29, 2007, 2 pages.

International Preliminary Report on Patentability for International Application No. PCT/US2006/029247 mailed Feb. 7, 2008, 12 pages.

International Preliminary Report on Patentability for International Application No. PCT/US2006/033859 mailed Mar. 20, 2008, 14 pages.

International Preliminary Report on Patentability for International Application No. PCT/US2007/019568 mailed Mar. 19, 2009, 10 pages.

International Preliminary Report on Patentability for International Application No. PCT/US2007/020181 mailed Apr. 2, 2009, 9 pages.

International Preliminary Report on Patentability for International Application No. PCT/US2007/020777 mailed Apr. 9, 2009, 12 pages.

International Preliminary Report on Patentability for International Application No. PCT/US2007/021023 mailed Apr. 9, 2009, 8 pages.

International Preliminary Report on Patentability for International Application No. PCT/US2007/022392 mailed Apr. 30, 2009, 14 pages.

International Search Report and Written Opinion for International Application No. PCT/US2006/019152 mailed Oct. 19, 2006, 11 pages.

International Search Report and Written Opinion for International Application No. PCT/US2006/029247 mailed May 7, 2007, 19 pages.

(56) References Cited

OTHER PUBLICATIONS

International Search Report and Written Opinion for International Application No. PCT/US2008/068377, mailed Jul. 6, 2009, 19 pages.
International Search Report and Written Opinion for International Application No. PCT/US2006/033859 mailed Sep. 12, 2007, 22 pages.
International Search Report and Written Opinion for International Application No. PCT/US2007/007373, dated Oct. 5, 2007, 13 pages.
International Search Report and Written Opinion for International Application No. PCT/US2007/019568 mailed Feb. 6, 2008, 13 pages.
International Search Report and Written Opinion for International Application No. PCT/US2007/020181 mailed Jan. 25, 2008, 15 pages.
International Search Report and Written Opinion for International Application No. PCT/US2007/020777 mailed Feb. 8, 2008, 18 pages.
International Search Report and Written Opinion for International Application No. PCT/US2007/021023 mailed Jun. 6, 2008, 10 pages.
International Search Report and Written Opinion for International Application No. PCT/US2007/022392 mailed Apr. 11, 2008, 20 pages.
International Search Report and Written Opinion for International Application No. PCT/US2006/019152, mailed May 17, 2005. 11 pages.
International Technology Roadmap for Semiconductors—Front End Processes, pp. 1-62 (2005).
Ipri et al., "MONO/POLY technology for fabricating low-capacitance CMOS integrated circuits," Electron Devices, IEEE Transactions, vol. 35, No. 8, Aug. 1988, pp. 1382-1383.
Ishibashi, et al., "3rd Topical Workshop on Heterostructure Microelectronics for Information Systems Applications," Aug.-Sep. 1998, 115 pages.
Ishitani et al., "Facet Formation in Selective Silicon Epitaxial Growth," 24 Japan, Journal of Applied Physics, vol. 10, 1985, pp. 1267-1269.
Ismail et al., "High-quality GaAs on Sawtooth-patterned Si Substrates," 59 Applied Physics Letters 19, 1991, pp. 2418-2420.
Jain et al., "Stresses in strained GeSi stripes and quantum structures: calculation using the finite element method and determination using micro-Raman and other measurements," Thin Solid Films 292, 1997, pp. 218-226.
Jeong, et al., "Performance improvement of InP-based differential HBT VCO using the resonant tunneling diode," 2006 International Conf. on Indium Phosphide and Related Mat. Conf. Proc., pp. 42-45.
Ju et al., "Epitaxial lateral overgrowth of gallium nitride on silicon substrate," Journal of Crystal Growth, vol. 263, No. 1-4, Mar. 1, 2004, pp. 30-34.
Kamins et al., "Kinetics of Selective Epitaxial Deposition of Si1-xGex," Hewlett-Packard Company, Palo Alto, CA, Appl. Phys. Lett. 61 (6), Aug. 10, 1992 (pp. 669-671).
Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11, No. 5, Sep.-Oct. 2005, pp. 1069-1073.
Kamiyama, et al., "UV light-emitting diode fabricated on hetero-ELO-grown $Al_{0.22}Ga_{0.78}N$ with low dislocation density," Physica Status Solidi A, vol. 192, No. 2, Aug. 2002, pp. 296-300.
Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.
Kazi et al., "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.
Kidoguchi et al., "Air-bridged lateral epitaxial overgrowth of GaN thin Films," Applied Physics Letters, vol. 76, No. 25, Jun. 19, 2000, pp. 3768-3770.
Kim et al., "Silicon-Based Field-Induced Band-to-Band Tunneling Effect Transistor," IEEE Electron Device Letters, No. 25, No. 6, 2004, pp. 439-441.
Kim et al., "GaN nano epitaxial lateral overgrowth on holographically patterned substrates," School of Physics and Inter-University Semiconductor Research Center, Seoul National University, Aug. 25-27, 2003, pp. 27-28.
Kimura et al., "Vibronic Fine Structure Found in the Blue Luminescence from Silicon Nanocolloids," Japan, Journal of Applied Physics, vol. 38, 1999, pp. 609-612.
Klapper, "Generation and Propagation of Dislocations During Crystal Growth," Mat. Chem. and Phys. vol. 66, 2000, pp. 101-109.
Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.
Kollonitsch, et al., "Improved Structure and Performance of the GaAsSb/InP Interface in a Resonant Tunneling Diode," Journal of Crystal Growth, vol. 287, 2006, pp. 536-540.
Krishnamurthy, et al., "I-V characteristics in resonant tunneling devices: Difference Equation Method," Journal of Applied Physics, vol. 84, Issue 9, Condensed Matter: Electrical and Magnetic Properties (PACS 71-76), 1998, 9 pages.
Krost et al., "GaN-based Optoelectronics on Silicon Substrates," Materials Science & Engineering, B93, 2002, pp. 77-84.
Sudingo et al., "Si-Based Resonant Interband Tunnel Diode/CMOS Integrated Memory Circuits," Rochester Institute of Technology, 2006, pp. 1-48.
Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.
Kushida et al., "Epitaxial growth of $PbTiO_3$ films on $SrTiO_3$ by RF magnetron sputtering," Ultrasonics, Ferroelectrics and Frequency Control, IEEE Transactions on Ultrasonics Ferroelectrics and Frequency Control, vol. 38, No. 6, Nov. 1991, pp. 656-662.
Kwok, "Barrier-Injection Transit Time Diode," Complete Guide to Semiconductor Devices, $2^{nd}$ ed., Chapter 18, 2002, pp. 137-144.
Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.
Langdo et al., "High Quality Ge on Si by Epitaxial Necking," Applied Physics Letters, vol. 76, No. 25, Jun. 19, 2000, pp. 3700-3702.
Langdo, "Selective SiGe Nanostructures," PhD Thesis, Massachusetts Institute of Technology, Jun. 2001, 215 pages.
Lee et al., "Growth of GaN on a nanoscale periodic faceted Si substrate by metal organic vapor phase epitaxy," Compound Semiconductors: Post-Conference Proceedings, Aug. 25-27, 2003, pp. 15-21.
Lee et al., "Strain-relieved, Dislocation-free $In_xGa_{1-x}As/GaAs(001)$ Heterostructure by Nanoscale-patterned Growth," Applied Physics Letters, vol. 85, No. 18, Nov. 1, 2004, pp. 4181-4183.
Li et al., "Defect Reduction of GasAs Epitaxy on Si (001) Using Selective Aspect Ratio Trapping," 91 Applied Physics Letters, 2007, pp. 021114-1-021114-3.
Li et al., "Heteroepitaxy of High-quality Ge on Si by Nanoscale Ge seeds Grown through a Thin Layer of $SiO_2$," Applied Physics Letters, vol. 85, No. 11, Sep. 13, 2004, pp. 1928-1930.
Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.
Li et al., "Selective Growth of Ge on Si (100) through Vias of $Si_{o2}$ Nanotemplate Using Solid Source Molecular Beam Epitaxy," Applied Physics Letters, vol. 83, No. 24, Dec. 15, 2003, pp. 5032-5034.
Liang et al., "Critical Thickness enhancement of Epitaxial SiGe films Grown on Small Structures," Journal of Applied Physics, vol. 97, 2005, pp. 043519-1-043519-7.
Lim et al., "Facet Evolution in Selective Epitaxial Growth of Si by cold-wall ultrahigh vacuum chemical vapor deposition," Journal of Vac. Sci. Tech., vol. B 22, No. 2, 2004, pp. 682.
Liu et al., "High Quality Single-crystal Ge on Insulator by Liquid-phase Epitaxy on Si Substrates," Applied Physics Letters, vol. 84, No. 14, Apr. 4, 2004, pp. 2563-2565.

(56) References Cited

OTHER PUBLICATIONS

Liu et al., "Rapid Melt Growth of Germanium Crystals with Self Aligned Microcrucibles on Si Substrates," Journal of the Electrochemical Society, vol. 152, No. 8, 2005, pp. G688-G693.
Loo et al., "Successful Selective Epitaxial $Si_{1-x}Ge_x$ Deposition Process for HBT-BiCMOS and High Mobility Heterojunction pMOS Applications," 150 Journal of Electrochemical Society 10, 2003, pp. G638-G647.
Lourdudoss et al., "Semi-insulating epitaxial layers for optoelectronic devices," Semiconducting and Insulating Materials Conference, SIMC-XI, 2000, pp. 171-178.
Luan et al., "High-quality Ge Epilayers on Si with Low Threading-dislocation Densities," Applied Physics Letters, vol. 75, No. 19, Nov. 8, 1999, pp. 2909-2911.
Luan, "Ge Photodetectors for Si Microphotonics," PhD Thesis, Massachusetts Institute of Technology, Department of Materials Science & Engineering, Jan. 12, 2001, 155 pages.
Lubnow et al., "Effect of III/V-Compound Epitaxy on Si Metal-Oxide-Semiconductor Circuits," Japan, Journal of Applied Physics, vol. 33, 1994, pp. 3628-3634.
Luo et al., Enhancement of (IN,Ga)N Light-Emitting Diode Performance by Laser Liftoff and Transfer From Sapphire to Silicon, IEEE Photonics Technology Letters, vol. 14, No. 10, 2002, pp. 1400-1402.
Luryi et al., "New Approach to the High Quality Epitaxial Growth of Latticed-Mismatched Materials," Applied Physics Letters, vol. 49, No. 3, Jul. 21, 1986, pp. 140-142.
Ma, et al., "A small signal equivalent circuit model for resonant tunneling diode," Chinese Physics Letters, vol. 23, No. 8, Aug. 2006, pp. 2292-2295.
Ma, et al., "Fabrication of an AlAs/In0.53/Ga0.47/As/InAs resonant tunneling diode on InP substrate for high-speed circuit applications," 27 Chinese J. Semiconductors 6, Jun. 2006, pp. 959-962.
Maekawa, et al., "High PVCR Si/Si1-x/Gex DW RTD formed with a new triple-layer buffer," Materials Science in Semiconductor Processing, vol. 8, 2005, pp. 417-421.
Maezawa, et al., "Metamorphic resonant tunneling diodes and its application to chaos generator ICs," 44 Jap. J. Applied Physics, Part 1, No. 7A, Jul. 2005, pp. 4790-4794.
Maezawa, et al., "InP-based resonant tunneling diode/HEMT integrated circuits for ultrahigh-speed operation," IEEE Nagoya University, Institute for Advanced Research, 2006, pp. 252-257.
Martinez et al., "Characterization of GaAs Conformal Layers Grown by Hydride Vapour Phase Epitaxy on Si Substrates By Microphotoluminescence Cathodoluminescence and MicroRaman," Journal of Crystal Growth, vol. 210, 2000, pp. 198-202.
Matsunaga et al., "A New Way to Achieve Dislocation-Free Heteroepitaxial Growth by Molecular Beam Epitaxy: Vertical Microchannel Epitaxy," Journal of Crystal Growth, vol. 237-239, 2002, pp. 1460-1465.
Matthews et al., "Defects in Epitaxial Multilayers—Misfit Dislocations," Journal of Crystal Growth, vol. 27, 1974, pp. 118-125.
Monroy, et al., "High UV/visible Contrast Photodiodes Based on Epitaxial Lateral Overgrown GaN layers," Electronics Letters, vol. 35, No. 17, Aug. 19, 1999, pp. 1488-1489.
Nakano et al., "Epitaxial Lateral Overgrowth of Aln Layers on Patterned Sapphire Substrates," Source: Physica Status Solidi A, vol. 203, No. 7, May 2006, pp. 1632-1635.
Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.
Naoi et al., "Epitaxial Lateral Overgrowth of GaN on Selected-area Si (111) Substrate with Nitrided Si Mask," Journal of Crystal Growth, vol. 248, 2003, pp. 573-577.
Naritsuka et al., "InP Layer Grown on (001) Silicon Substrate by Epitaxial Lateral Overgrowth," Japan, Journal of Applied Physics, vol. 34, 1995, pp. L1432-L1435.
Naritsuka et al., "Vertical Cavity Surface Emitting Laser Fabricated on GaAs Laterally Grown on Si Substrate," Electrochemical Society Proceedings, vol. 97, No. 21, pp. 86-90.
Neudeck, et al., "Novel silicon Epitaxy for advanced MOSFET devices," Electron Devices Meeting, IEDM Technical Digest International, 2000, pp. 169-172.
Neumann et al., "Growth of III-V Resonant Tunneling Diode on Si Substrate with LP-MOVPE," Journal of Crystal Growth, vol. 248, 2003, pp. 380-383.
Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.
Noborisaka, J., et al., Fabrication and characterization of freestanding GaAs/AlGaAs core-shell nanowires and AlGaAs nanotubes by suing selective-area metalorganic vapor phase epitaxy, Applied Physics Letters, vol. 87, Aug. 24, 2005, pp. 093109-1-093109-3.
Noda, et al., "Current-voltage characteristics in double-barrier resonant tunneling diodes with embedded GaAs quantum rings," Physica E 32, 2006, pp. 550-553.
Norman, et al., "Characterization of MOCVD Lateral Epitaxial Overgrown III-V Semiconductor Layers on GaAs Substrates," Compound Semiconductors, Aug. 25-27, 2003, pp. 45-46.
Notification of International Search Report and the Written Opinion of the International Searching Authority for PCT/US2010/029552, Applicant: Taiwan Semiconductor Manufacturing.Company, Ltd., May 26, 2010, 15 pages.
Oehrlein et al., "Studies of the Reactive Ion Etching of SiGe Alloys," J. Vac. Sci. Tech, A9, No. 3, May/Jun. 1991, pp. 768-774.
Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.
Parillaud et al., "High Quality InP on Si by Conformal Growth," Applied Physics Letters, vol. 68, No. 19, May 6, 1996, pp. 2654-2656.
Park et al., "Defect Reduction and its Mechanism of Selective Ge Epitaxy in Trenches on Si(001) Substrates Using Aspect Ratio Trapping," Mat. Res. Society Symp. Proc., vol. 994, 2007, 6 pages.
Park et al., "Defect Reduction of Selective Ge Epitaxy in Trenches on Si (001) Substrates Using Aspect Ratio Trapping," Applied Physics Letters 90, 052113, Feb. 2, 2007, 3 pages.
Park et al., "Growth of Ge Thick Layers on Si (001) Substrates Using Reduced Pressure Chemical Vapor Deposition," 45 Japan, Journal of Applied Physics, vol. 11, 2006, pp. 8581-8585.
Partial International Search for International Application No. PCT/US2006/033859 mailed Jun. 22, 2007, 7 pages.
Partial International Search Report for International Application No. PCT/US2008/004564 completed Jul. 22, 2009, mailed Oct. 16, 2009, 5 pages.
Partial International Search Report for International Application No. PCT/US2008/068377, completed Mar. 19, 2008, mailed Apr. 22, 2008, 3 pages.
PCT International Search Report of PCT/US2009/057493, from PCT/ISA/210, mailed Mar. 22, 2010, Applicant: Amberwave System Corporation et al., 2 pages.
Pidin et al., "MOSFET Current Drive Optimization Using Silicon Nitride Capping Layer for 65-nm Technology Node," Symposium on VLSI Technology, Dig. Tech. Papers, 2004, pp. 54-55.
Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. "QUDOS Technical Report," 2002-2004, 77 pages.
Prost, et al., "High-speed InP-based resonant tunneling diode on silicon substrate," Proceedings of the 31st European Solid-State Device Research Conf., 2005, pp. 257-260.
Radulovic, et al., "Transient Quantum Drift-Diffusion Modelling of Resonant Tunneling Heterostructure Nanodevices," Physics of Semiconductors: $27^{th}$ International Conference on the Physics of Semiconductors—ICPS-27, Jun. 2005 AIP Conf. Proc., pp. 1485-1486.
Reed et al., "Realization of a Three-Terminal Resonant Tunneling Device: The Bipolar Quantum Resonant Tunneling Transistor," 54 Applied Physics Letters 11, 1989, p. 1034.

(56) References Cited

OTHER PUBLICATIONS

Ren et al., "Low-dislocation-density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-111901-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs," IEDM Tech. Dig., 2003, pp. 49-52.
Ringel et al., "Single-junction InGaP/GaAs Solar Cells Grown on Si Substrates with SiGe Buffer Layers," Prog Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Pal, et al., "Multiple Layers of Silicon-on-Insulator Islands Fabrication by Selective Epitaxial Growth," Electron Device Letters, IEEE, vol. 20, No. 5, May 1999, pp. 194-196.
Sass, et al., "Strain in GaP/GaAs and GaAs/GaP resonant tunneling heterostructures," Journal of Crystal Growth, vol. 248, Feb. 2003, pp. 375-379.
Schaub, et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Seabaugh et al., "Promise of Tunnel Diode Integrated Circuits," Tunnel Diode and CMOS/HBT Integration Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical-Mechanical Polishing," Electron Devices Meeting, Technical Digest, International, Dec. 9-12, 1990, pp. 587-590.
Shichijo et al., "Co-Integration of GaAs MESFET & Si CMOS Circuits," 9 Elec. Device Letters 9, Sep. 1988, pp. 444-446.
Shubert, E.F., "Resonant tunneling diode (RTD) structures," Rensselear Polytechnic Institute, 2003, pp. 1-14.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group III-nitride Nanowires and Nanostructures by Metalorganic Chemical Vapor Deposition," Applied Physics Letters, vol. 86, 2005, pp. 013105-1-013105-3.
Su et al., "New Planar Self-Aligned Double-Gate Fully-depleted P-MOSFETs Using Epitaxial Lateral Overgrowth (ELO) and selectively grown source/drain (S/D)," 2000 IEEE Int'l. SOI Conf., pp. 110-111.
Suhara, et al, "Characterization of argon fast atom beam source and its application to the fabrication of resonant tunneling diodes," 2005 International Microprocesses and Nanotechnology Conf. Di Of Papers, 2005, pp. 132-133.
Sun et al., "Electron resonant tunneling through InAs/GaAs quantum dots embedded in a Schottky diode with an AlAs insertion layer," 153 J. Electrochemical Society 153, 2006, pp. G703-G706.
Sun et al., "Room-temperature observation of electron resonant tunneling through InAs/AlAs quantum dots," 9 Electrochemical and Solid-State Letters 5, May 2006, pp. G167-G170.
Sun et al., "InGaAsP Multi-Quantum Wells at 1.5 /splmu/m Wavelength Grown on Indium Phosphide Templates on Silicon," Indium Phosphide and Related Materials, May 12-16, 2003, pp. 277-280.
Sun et al., "Selective Area Growth of InP on InP Precoated Silicon Substrate by Hydride Vapor Phase eiptaxy," Indium Phosphide and Related Materials Conference, IPRM. 14$^{th}$, 2002, pp. 339-342.
Sun et al., "Sulfur Doped Indium Phosphide on Silicon Substrate Grown by Epitaxial Lateral Overgrowth," Indium Phosphide and Related Materials 16$^{th}$ IPRM, May 31-Jun. 4, 2004, pp. 334-337.
Sun et al., "Temporally Resolved Growth of InP in the Opening Off-Oriented from [110] Direction," Idium Phosphide and Related Materials, Conference Proceedings, 2000 International Conference, pp. 227-230.
Sun et al., "Thermal Strain in Indium Phosphide on Silicon Obtained by Epitaxial Lateral Overgrowth," 94 Journal of Applied Physics 4, 2003, pp. 2746-2748.
Suryanarayanan et al., "Microstructure of Lateral Epitaxial Overgrown InAs on (100) GaAs Substrates," Applied Physics Letters, vol. 83, No. 10, Sep. 8, 2003, pp. 1977-1979.
Suzuki, et al., "Mutual injection locking between sub-THz oscillating resonant tunneling diodes," Japan Science and Technology Agency, IEEE, Joint 30$^{th}$ International Conference on Infrared and Millimeter Waves & 13$^{th}$ International Conference on Terahertz Electronics, 2005, pp. 150-151.
Takasuka et al., "AlGaAs/InGaAs DFB Laser by One-Time Selective MOCVD Growth on a Grating Substrate," 43 Japan, Journal of Applied Physics, 4B, 2004, pp. 2019-2022.
Takasuka et al., "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.
Tamura et al., "Heteroepitaxy on High-Quality GaAs on Si for Optical Interconnections on Si Chip," Proceedings of the SPIE, vol. 2400, 1995, pp. 128-139.
Tamura et al., "Threading Dislocations in GaAs on Pre-patterned Si and in Post-Patterned GaAs on Si," Journal of Crystal Growth, vol. 147, 1995, pp. 264-273.
Tanaka et al., "Structual Characterization of GaN Lateral Overgorwn on a (111) Si Substrate," Applied Physics Letters, vol. 79, No. 7, Aug. 13, 2001, pp. 955-957.
Thean et al., "Uniaxial-Biaxial Hybridization for Super-Critical Strained-Si Directly on Insulator (SC-SSOI) PMOS with Differenc Channel Oreintations," IEEE, 2005, pp. 1-4.
Thelander, et al., "Heterostructures incorporated in one-dimensional semiconductor materials and devices," Physics of Semiconductors, vol. 171, 2002, 1 page. Abstract Only.
Thompson et al., "A Logic Nanotechnology Featuring Strained-Silicon," 25 IEEE Electron Device Letters 4, 2004, pp. 191-193.
Ting, et al., "Modeling Spin-Dependent Transport in InAS/GASb/AlSb Resonant Tunneling Structures," 1 J. Computational Electronics, 2002, pp. 147-151.
Tomiya et al., "Dislocation Related Issues in the Degradation of GaN-Based Laser Diodes," Selected in Quantum Electronics, IEEE Journal of Selected Topics in Quantum Electronics, vol. 10, No. 6, Nov./Dec. 2004, pp. 1277-1286.
Tomiya, "Dependency of crystallographic tilt and defect distribution of mask material in epitaxial lateral overgrown GaN layers," Applied Physics Letters vol. 77, No. 5, pp. 636-638.
Tran et al., "Growth and Characterization of InP on Silicon by MOCVD," Journal of Crystal Growth, vol. 121, pp. 365-372.
Tsai, et al., "InP/InGaAs resonant tunneling diode with six-route negative differential resistances," 13th European Gallium Arsendie and other Compound Semiconductors Application Symp., 2006, pp. 421-423.
Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.
Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.
Tseng et al., "Effects of Isolation Materials on Facet Formation for Silicon Selective Epitaxial Growth," 71 Applied Physics Letters 16, 1997, pp. 2328.

(56) References Cited

OTHER PUBLICATIONS

Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.

Ujiie, et al., Epitaxial Lateral Overgrowth of GaAs on a Si Substrate, 28, Japan, Journal of Applied Physics, vol. 3, Mar. 1989, pp. L337-L339.

Usuda et al., "Strain Relaxation of Strained-Si Layers on SiGe-on-Insulator (SGOI) Structures After Mesa Isolation," Applied Surface Science, vol. 224, 2004, pp. 113-116.

Usui et al., "Thick GaN Epitaxial Growth with Low Dislocation Density by Hydride Vapor Phase Epitaxy," vol. 36, Japan, Journal of Applied Physics, 1997, pp. L899-L902.

Vanamu et al., "Epitaxial Growth of High-Quality Ge Films on Nanostructured Silicon Substrates," Applied Physics Letters, vol. 88, 2006, pp. 204104.1-204-104.3.

Vanamu et al., "Growth of High Quality Ge/Si$_{1-x}$Ge$_x$ on Nano-scale Patterned Si Structures," J. Vac. Sci. Technology, B, vol. 23, No. 4, Jul./Aug. 2005, pp. 1622-1629.

Vanamu et al., "Heteroepitaxial Growth on Microscale Patterned Silicon Structures," Journal of Crystal Growth, vol. 280, 2005, pp. 66-74.

Vanamu et al., "Improving Ge Si$_x$Ge$_{1-x}$, Film Quality through Growth onto Patterned Silicon Substrates," Advances in Electronics Manufacturing Technology, Nov. 8, 2004, pp. 1-4.

Vescan et al., "Lateral Confinement by Low Pressure Chemical Vapor Deposition-Based Selective Epitaxial Growth of Si$_{1-x}$Ge$_x$Si Nanostructures," No. 81, Journal of Applied Physics 10, 1997, pp. 6709-6715.

Vetury et al., "First Demonstration of AlGaN/GaN Heterostructure Field Effect Transistor on GaN Grown by Lateral Epitaxial Overgrowth (ELO)," Inst. Phys. Conf. Ser. No. 162: Ch. 5, Oct. 1998, pp. 177-183.

Walker, et al., "Magnetotunneling spectroscopy of ring-shaped (InGa)As quantum dots: Evidence of excited states with 2pz character," 32 Physica E 1-2, May 2006, pp. 57-60.

Wang et al, "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.

Watanabe, et al., "Fluoride resonant tunneling didodes on Si substrates," IEEE International Semiconductor Device Research Symp. Dec. 2005, pp. 177-178.

Wernersson et al., "InAs Epitaxial Lateral Growth of W Marks," Journal of Crystal Growth, vol. 280, 2005, pp. 81-86.

Williams et al., "Etch Rates for Micromachining Processing—Part II," Journal of Microelectromechanical Systems, vol. 4, 1996, pp. 761-778.

Williams et al., "Etch Rates for Micromachining Processing—Part II," Journal of Microelectromechnical Systems, vol. 5, No. 4, Dec. 1996, pp. 256-269.

Wu et al., "Enhancement-mode InP n-channel metal-oxide-semiconductor field-effect-transistors with atomic-layer-deposited Al2O3 dielectrics," Applied Physics Letters 91, 022108-022110 (2007).

Wu et al., Gross-Sectional Scanning/Tunneling Microscopy Investigations of Cleaned III-V Heterostructures, Technical report, Dec. 1996, 7 pages.

Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.

Wuu et al., "Defect Reduction and Efficiency Improvement of Near-Ultraviolet Emitters via Laterally Overgrown GaN on a GaN/Patterned Sapphire Template," Applied Physics Letters, vol. 89, No. 16, Oct. 16, 2006, pp. 161105-1-161105-3.

Xie et al., "From Porous Si to Patterned Si Substrate: Can Misfit Strain Energy in a Continuous Heteropitaxial Film Be Reduced?" Journal of Vacuum Science Technology, B, vol. 8, No. 2, Mar./Apr. 1990, pp. 227-231.

Xu et al., "Spin-Filter Devices Based on Resonant Tunneling Antisymmetrical Magnetic Semiconductor Hybrid Structures," vol. 84, Applied Physics Letters 11, 2004, pp. 1955-1957.

Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.

Yamaguchi et al., "Defect Reduction Effects in GaAs on Si Substrates by Thermal Annealing," Applied Physics Letters vol. 53, No. 23, 1998, pp. 2293.

Yamaguchi et al., GaAs Solar Cells Grown on Si Substrates for Space Use: Prog. Photovolt.: Res. Appl., vol. 9, 2001; pp. 191-201.

Yamaguchi et al., "Super-High-Efficiency Multi-junction Solar Cells," Prog. Photovolt.: Res. Appl., vol. 13, 2005, pp. 125-132.

Yamamoto et al., "Optimization of InP/Si Heteroepitaxial Growth Conditions Using Organometallic Vapor Phase Epitaxy," Journal of Crystal Growth, vol. 96, 1989, pp. 369-377.

Yang et al., "High Performance CMOS Fabricated on Hybrid Substrate with Different Crystal Orientations," IEDM Tech. Dig., 2003, pp. 453-456.

Yang et al., "Selective Area Deposited Blue GaN-InGaN Multiple-quantum Well Light Emitting Diodes over Silicon Substrates," Applied Physics Letter, vol. 76, No. 3, Jan. 17, 2000, pp. 273-275.

Yili, et al., "Physics-based hydrodynamic simulation of direct current characteristics in DBRTD," 29 Chinese J. Electron Devices 2, Jun. 2006, pp. 365-368.

Yin et al., "Ultrathin Strained-SOI by Stress Balance on Compliant Substrates and FET Performance," 52 IEEE Trans On Electron Devices 10, 2005, pp. 2207-2214.

Yingda, et al., "Selective area growth of InP through narrow openings by MOCVD and its application to inP HBT," Indium Phosphide and Related Materials, International Conference, May 12-16, 2003, pp. 389-392.

Yoon et al., "Selective Growth of Ge Islands on Nanometer-scale Patterned SiO$_2$/Si Substrate by Molecular Beam Epitaxy," Applied Physics Letters, vol. 89, 2006, pp. 063107.1-063107.3.

Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-L462.

Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.

Zang at al., "Nanoheteroepitaxial lateral overgrowth of GaN on nanoporous Si (111)," Applied Physics Letters, vol. 88, No. 14, Apr. 3, 2006, pp. 141925.

Zang et al., "Nanoscale lateral epitaxial overgrowth of GaN on Si (111)," Applied Physics Letters, vol. 87, No. 19 (Nov. 7, 2005) pp. 193106.1-193106.3.

Zela et al., "Single-crystalline Ge Grown Epitaxially on Oxidized and Reduced Ge/Si (100) Islands," Journal of Crystal Growth, vol. 263, 2004, pp. 90-93.

Zhang et al., "Removal of Threading Dislocations from Patterned Heteroepitaxial Semiconductors by Glide to Sidewalls," Journal of Electronic Materials, vol. 27, No. 11, 1998, pp. 1248-1253.

Zhang et al., "Strain Status of Self-Assembled InAs Quantum Dots," Applied Physics Letters, vol. 77, No. 9, Aug. 28, 2000, pp. 1295-1297.

Zheleva et al., "Lateral Epitaxy and Dislocation Density Reduction in Selectively Grown GaN Structures," Journal of Crystal Growth, vol. 222, No. 4, Feb. 4, 2001, pp. 706-718.

Zubia et al., "Initial Nanoheteroepitaxial Growth of GaAs on Si (100) by OMVPE," Journal of Electronic Materials, vol. 30, No. 7, 2001, pp. 812-816.

European Search Report issued by the European Patent Office on Dec. 15, 2010 in European Patent Application No. 10002884.4 (10 pages).

Hydrick et al., "Chemical Mechanical Polishing of Epitaxial Germanium on SiO$_2$-patterned Si(001) Substrates," ECS Transactions, 16 (10), 2008, (pp. 237-248).

Li et al, "Monolithic Integration of GaAs/InGaAs Lasers on Virtual Ge Substrates via Aspect-Ratio Trapping," Journal of the Electrochemical Society, vol. 156, No. 7, 2009, pp. H574-H578.

Park et al., "Fabrication of Low-Defectivity, Compressively Strained Geon Si$_{0.2}$G$^e_{0.8}$ Structures Using Aspect Ratio Trapping," Journal of The Electrochemical Society, vol. 156, No. 4, 2009, pp. H249-H254.

* cited by examiner

DEFECT REDUCTION USING ASPECT RATIO TRAPPING

RELATED APPLICATIONS

This application is a divisional of U.S. patent application Ser. No. 11/852,078, filed on Sep. 7, 2007, entitled "Defect Reduction Using Aspect Ratio Trapping," which claims the benefit of and priority to U.S. Provisional Application Ser. No. 60/842,771, filed Sep. 7, 2006, and U.S. Provisional Application Ser. No. 60/873,903, filed Dec. 8, 2006; the entire disclosures of these applications are hereby incorporated by reference in their entireties.

FIELD OF THE INVENTION

The invention relates generally to semiconductor processing and particularly to blocking defects by aspect ratio trapping ("ART").

BACKGROUND

The formation of lattice-mismatched materials has many practical applications. For example, germanium (Ge) heteroepitaxy on silicon (Si) is promising both for, e.g., high-performance Ge p-channel metal-oxide-semiconductor field-effect transistors (MOSFETs) and as a potential path for integrating optoelectronic devices with Si complementary metal-oxide semiconductor (CMOS) technology. Heteroepitaxially growing Ge on Si also is a path for providing a substitute for Ge wafers for many other applications such as photovoltaics and light-emitting diodes, provided that a sufficiently high-quality Ge surface can be obtained cost-effectively. Unfortunately, growing more than a few nanometers (nm) of Ge directly on Si can lead to a dislocation density of $10^8$-$10^9$/cm$^2$ due to the 4.2% lattice mismatch, which is unacceptable for most applications. Various solutions involving thick epitaxial layers (most successfully to date via graded-buffer technology) or post-growth high-temperature annealing have been explored to alleviate this problem. However, for true ease of integration with Si CMOS technology, a defect reduction solution involving low epitaxial layer thickness (to meet planarity requirements for Si processing) and low thermal budget (to allow addition of Ge at any point in the process without degrading the CMOS transistor elements) is highly desirable.

SUMMARY

The "epitaxial necking" technique is effective for growing Ge on Si for small areas, e.g., circular regions of diameter ≤200 nm. Epitaxial necking involves selective growth in patterned openings bounded by substantially vertical dielectric sidewalls, enabling dislocations to be trapped under certain conditions. See E. A. Fitzgerald and N. Chand, *J. Electron. Mat.* 20, 839 (1991), and T. A. Langdo, C. W. Leitz, M. T. Currie, and E. A. Fitzgerald, A. Lochtefeld and D. A. Antoniadis, *Appl. Phys. Lett.* 76 (25), 3700 (2000). Langdo et al. demonstrated defect-free Ge regions grown by ultrahigh vacuum chemical vapor deposition in 100 nm diameter holes in SiO$_2$ on a Si substrate; similar results were obtained for Ge/Si grown by molecular beam epitaxy. See Qiming Li, Sang M. Han, Steven R. J. Brueck, Stephen Hersee, Ying-Bing Jiang, and Huifang Xu, *Appl. Phys. Lett.* 83 (24) 5032 (2003).

The present inventors have found that the orientation of the epitaxial layer surface during growth plays a dominant role in determining the configurations of many of the threading dislocations in the layers. These dislocations behave as "growth dislocations," which, during growth, are oriented approximately normal to the growth surface that they intersect. If the normal is not parallel to a dielectric sidewall that bounds the growth opening, then the dislocations are guided out from the central regions of the patterned opening. Thus, by properly engineering the profile of the growth surface during growth, certain kinds of threading dislocations may be caused to grow out of the epitaxial layer and terminate at the dielectric sidewalls, thereby increasing the effectiveness of defect trapping.

As used herein, "aspect ratio trapping" refers generally to the technique(s) of causing defects to terminate at non-crystalline, e.g., dielectric sidewalls, where the sidewalls are sufficiently high relative to the size of the growth area so as to trap most, if not all, of the defects.

Processing conditions may be tailored to enable effective trapping of threading dislocations in trenches of arbitrary length, including, e.g., for Ge grown directly on Si via reduced pressure chemical vapor deposition (RPCVD), e.g., the deposition of Ge layers as thin as 450 nm in SiO$_2$ trenches having an aspect ratio >1 ("AR," defined for trenches as the ratio of the trench height/width).

In an aspect, the invention features a method for forming a structure, the method including the steps of providing a crystalline semiconductor substrate comprising a first semiconductor material and having a top surface, and defining an opening having a non-crystalline sidewall proximate the top surface of the crystalline semiconductor substrate. An epitaxial film is formed in the opening. The epitaxial film includes a second semiconductor material that is lattice mismatched to the first semiconductor material. The epitaxial film has a growth front, the growth front including a surface having a facet substantially non-parallel to the substrate top surface. Forming the epitaxial film includes configuring epitaxial film formation parameters to cause formation of the facet. A dislocation in the epitaxial film is approximately normal to the epitaxial film surface.

In another aspect, the invention features a method for forming a structure, the method including the steps of providing a crystalline semiconductor substrate comprising a first semiconductor material and having a top surface, and defining an opening having a non-crystalline sidewall proximate the top surface of the crystalline semiconductor substrate. An epitaxial film is formed in the opening. The epitaxial film includes a second semiconductor material that is lattice mismatched to the first semiconductor material. The epitaxial film has a growth front, the growth front including a surface having a facet not parallel to the substrate top surface. A dislocation in the epitaxial film is approximately normal to the epitaxial film surface.

Embodiments may include one or more of the following features. The non-crystalline sidewall may include a dielectric sidewall and/or have a sloped profile. The opening may be defined in a dielectric material disposed over the top surface of the substrate. The facet may define an angle α with the top surface of the substrate, and an aspect ratio H of a height h of the opening to a width w of the opening is greater than or equal to (tan α+1/tan α)/2. The height h may be selected from the range of 0.05 micrometer (μm) to 5 μm.

The opening may include a trench. In some embodiments, the dislocation in the epitaxial film is no more than about 8° off normal to the epitaxial film surface. The first semiconductor material may include a group IV element or compound, such as germanium and/or silicon, e.g., (100) silicon. The second semiconductor material may include at least one of a group IV element or compound, a III-V compound, or a II-VI compound. Examples of III-V compounds include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), indium antimonide (InSb), aluminum nitride (AlN), gallium nitride (GaN), indium nitride (InN), and their ternary and quaternary compounds. Examples of II-VI compounds includes zinc selenide (ZnSe), zinc telluride (ZnTe), cadmium selenide (CdSe), cadmium telluride (CdTe), zinc sulfide (ZnS), and their ternary and quaternary compounds.

In another aspect, the invention features a structure including a substrate comprising a first semiconductor material. An insulator layer is disposed over the substrate and defines a trench having a sidewall. A second semiconductor material is disposed in the trench, with the second semiconductor material being lattice mismatched to the first semiconductor material. A bottom portion of the second semiconductor material includes lattice defects, the defects are normal to the top surface of the second semiconductor material, and a profile of the top surface of the second semiconductor material is configured to direct the defects towards the sidewall.

In yet another aspect, the invention features a method for forming a structure, the method including defining an opening in a dielectric material disposed over a crystalline semiconductor substrate comprising a first semiconductor material. An epitaxial film is formed in the opening, the epitaxial film including a second semiconductor material lattice-mismatched to the first semiconductor material, the epitaxial film including a growth front having a surface, a dislocation in the epitaxial film being directed in a direction generally perpendicular to the growth front surface. The growth front surface defines an angle $\alpha$ with a top surface of the substrate such that the epitaxial film growth front surface is substantially non-parallel to a top surface of the substrate, and an aspect ratio H of a height h of the opening to a width w of the opening is greater than or equal to $(\tan \alpha + 1/\tan \alpha)/2$.

In some embodiments, the opening defines a trench having a length at least twice the width w. The length of the trench may be at least 6 millimeters (mm), the width of the trench may be less than 400 nm, and/or the depth of the trench may be less than 490 nm. The substrate may be off-cut by up to about 6°. The second semiconductor material may include a first layer grown at a first set of processing conditions, and a second layer disposed over the first layer and grown at a second set of processing conditions. For example, the first layer may be grown at a first temperature and the second layer may be grown over the first layer at a second temperature, with the second temperature being higher than the first temperature. The first semiconductor material may include a group IV material and the second semiconductor material may include a III-V compound that possibly includes a cubic structure. A transistor or an opto-electronic device comprising at least a portion of the second semiconductor material may be formed.

In another aspect, the invention features a method for forming a structure, the method including defining a trench having a longitudinal axis and a dielectric sidewall disposed adjacent a substrate comprising a first semiconductor material. A second semiconductor material is epitaxially grown in the trench, the second semiconductor material having a lattice mismatch with the first semiconductor material. Defects arising from the lattice mismatch between the first and second semiconductor materials propagate away from the longitudinal axis of the trench in a direction substantially perpendicular to a growth front of the second material and are trapped by a sidewall of the trench.

One or more of the following features may be included. The length of the trench may be at least 6 mm, the width of the trench may be less than 400 nm, and/or the depth of the trench may be less than 490 nm. In some embodiments, the trench includes a first face and a second face, the longitudinal axis intersecting the first and second faces, and substantially no defects intersecting the first and second faces. The substrate may be off-cut by 6°. The second semiconductor material may include a buffer layer grown at a low temperature, and a growth layer may be disposed over the buffer layer and grown at a higher temperature. A transistor or an opto-electronic device comprising at least a portion of the second semiconductor material may be formed. Defining the trench may include plasma ashing.

In another aspect, the invention features a method for forming a structure, including defining a trench in a dielectric material disposed over a substrate comprising a first semiconductor material. The trench has a longitudinal axis and is filled with a second semiconductor material by growing a first layer at a first set of processing conditions and by growing a second layer over the first layer at a second set of processing conditions. Defects in the second semiconductor material are propagated away from the longitudinal axis and are trapped by a sidewall of the trench.

One or more of the following features may be included. The first semiconductor material may include a group IV material and the second semiconductor material may include a III-V compound. The III-V compound may include a cubic structure. The first layer may be grown at a first temperature and the second layer is grown over the first layer at a second temperature, the second temperature being higher than the first temperature.

In yet another aspect, the invention includes a method for forming a structure, the method including the steps of performing a selective etch to expose a crystal plane of a crystalline substrate including a first semiconductor material, and forming a dielectric layer over the substrate. An opening is defined in the dielectric layer to reveal the exposed crystal plane. A second semiconductor material is formed in the opening, and dislocations lying in a plane approximately normal to a growth surface of the second semiconductor material are directed to a sidewall of the opening.

In an aspect, the invention includes a method for forming a structure, the method including defining an opening in a dielectric material disposed over a crystalline semiconductor substrate comprising a first semiconductor material. An epitaxial film is formed in the opening, the epitaxial film including a second semiconductor material lattice-mismatched to the first semiconductor material. A growth front of the epitaxial film includes a surface. A dislocation in the epitaxial film is approximately normal to the epitaxial film surface, the epitaxial film surface defines an angle $\alpha$ with a top surface of the substrate, and the angle $\alpha$ is selected to direct the dislocation.

One or more of the following features may be included. The epitaxial film surface may include a facet that defines the angle $\alpha$ with respect to the top surface of the substrate, and an aspect ratio H of a height h of the opening to a width w of the opening is greater than or equal to $(\tan \alpha + 1/\tan \alpha)/2$. The aspect ratio H may be greater than 0.5. The height h may be selected from the range of 0.05 μm to 5 μm. The angle $\alpha$ may be between about 0° and 90°.

In another aspect, the invention features a method for forming a structure, the method including defining an opening in a dielectric material disposed over a crystalline semiconductor substrate comprising a first semiconductor material. An epitaxial film is formed in the opening, the epitaxial film including a second semiconductor material lattice-mismatched to the first semiconductor material. The epitaxial film also includes a growth front that includes a surface, a dislocation in the epitaxial film being directed in a direction substantially perpendicular to the surface. The surface defines an angle α with a top surface of the substrate, and an aspect ratio H of a height h of the opening to a width w of the opening is greater than or equal to (tan α+1/tan α)/2.

One or more of the following features may be included. A dislocation in the epitaxial film may be directed in a direction within about 8° of a line perpendicular to the surface of the growth front. The angle α is typically selected such that the epitaxial film surface directs the dislocation to a sidewall of the opening. The epitaxial film surface may include a facet that defines an angle α with the top surface of the substrate. The aspect ratio H may be greater than 0.5. The height h may be selected from the range of 0.05 µm to 5 µm. The angle α may be selected from the range of between about 0° and 90°.

In another aspect, the invention includes a method for forming a structure, the method including defining an opening in a dielectric material disposed over a crystalline semiconductor substrate comprising a first semiconductor material. An epitaxial film is formed in the opening, the epitaxial film including a second semiconductor material that includes a growth front that includes a facet. The facet is selected such that a plane normal to the facet defines an angle θ with a sidewall of the opening and the facet directs the dislocation to the sidewall in a direction generally normal to the facet. The angle θ may between about 0° and 90°.

In another aspect, the invention includes a method for forming a structure, including defining a trench in a dielectric material disposed over a substrate comprising a first semiconductor material. The trench is filled with a second semiconductor material having a lattice mismatch with the first semiconductor material. Defects arising from the lattice mismatch between the first and second semiconductor materials propagate in a direction substantially perpendicular to a growth front of the second material and are trapped by a sidewall of the trench, with the trench having an arbitrary length.

DETAILED DESCRIPTION

Figure 1:
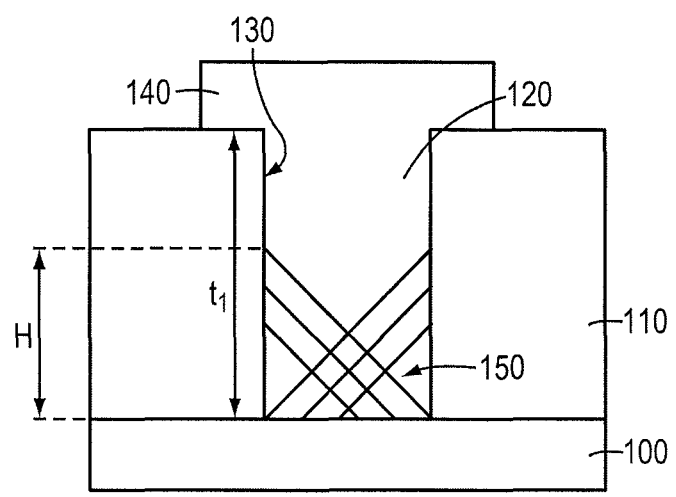
FIG. 1 is a schematic diagram illustrating defect trapping for the case of "slip dislocations" as defined below.

Referring to FIG. 1, a substrate 100, e.g., a crystalline semiconductor substrate, includes a first semiconductor material. The substrate 100 may be, for example, a bulk silicon wafer, a bulk germanium wafer, a semiconductor-on-insulator (SOI) substrate, or a strained semiconductor-on-insulator (SSOI) substrate. The substrate 100 may include or consist essentially of a first semiconductor material, such as a group IV element, e.g., Ge or Si. In an embodiment, substrate 100 includes or consists essentially of (100) silicon.

A non-crystalline material, such as a dielectric layer 110, is formed over the semiconductor substrate 100. The dielectric layer 110 may include a dielectric material, such as silicon nitride or silicon dioxide. The dielectric layer 110 may be formed by a method known to one of skill in the art, e.g., thermal oxidation or plasma-enhanced chemical vapor deposition. As discussed below, the dielectric layer may have a thickness $t_1$ corresponding to a desired height of crystalline material to be deposited in an opening formed through the dielectric layer. In some embodiments, the thickness t, of the dielectric layer 110 may range from, e.g., 25 nm to 2000 nm.

A mask (not shown), such as a photoresist mask, is formed over the substrate 100 and the dielectric layer 110. The mask is patterned to expose at least a portion of the dielectric layer 110. The exposed portion of the dielectric layer 110 is removed by, e.g., reactive ion etching (RIE) to define an opening 120, which extends to a surface of the substrate 100 and may be defined by at least one sidewall 130, e.g., a non-crystalline sidewall. The height h of sidewall 130 may be at least equal to a predetermined vertical distance H from the surface of the substrate. For a semiconductor grown epitaxially in this opening, where the lattice constant of the semiconductor differs from that of the substrate, it is possible to trap crystalline defects in the epitaxial region at the epitaxial layer/sidewall interface, within the predetermined distance H, when the ratio of H to the width w of the opening is properly chosen. Criteria for selecting the appropriate H/w ratio are discussed below.

The opening 120 may be a trench, i.e., it may be substantially rectangular in terms of cross-sectional profile, a top view, or both, and have a width w that is smaller than a length 1 (not shown) of the opening. For example, the width w of the opening may be less than about 500 nm, e.g., about 10-100 nm, and the length 1 of the opening may exceed each of w and H. The height h of the opening may be selected from a range of 0.05 µm to 5 µm. A ratio of the height h of the opening to the width w of the opening 120 may be ≥0.5, and in some embodiments, ≥1. The length 1 may be at least twice the width w.

A second crystalline semiconductor material 140 is formed in the opening 120. The second crystalline semiconductor material 140 may include or consist essentially of a group IV element or compound, a III-V compound, or a II-VI compound. Examples of suitable group IV elements or compounds include Ge, silicon germanium (SiGe), and silicon carbide (SiC). Examples of suitable III-V compounds include GaAs, GaP, GaSb, GaN, InAs, InP, InSb, InN, AlAs, AlP, AlSb, AlN, and/or their ternary or quaternary compounds. Examples of suitable II-VI compounds include ZnSe, ZnTe, CdSe, CdTe, ZnS, and/or their ternary or quaternary compounds.

The second crystalline semiconductor material 140 may be formed by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHVCVD), molecular beam epitaxy (MBE), or atomic layer deposition (ALD). In the CVD process, selective epitaxial growth typically includes introducing a source gas into the chamber. The source gas may include at least one precursor gas and a carrier gas, such as, for example, hydrogen. The reactor chamber may be heated by, for example, RF-heating. The growth temperature in the chamber may range from about 300° C. to about 1100° C., depending on the composition of the crystalline material and the desired growth rate. The growth system may also utilize low-energy plasma to enhance the layer growth kinetics.

The epitaxial growth system may be a single-wafer or multiple-wafer batch reactor. Suitable CVD systems commonly used for volume epitaxy in manufacturing applications include, for example, an Aixtron 2600 multi-wafer system available from Aixtron, based in Aachen, Germany; an EPI CENTURA single-wafer multi-chamber systems available from Applied Materials of Santa Clara, Calif.; or EPSILON single-wafer epitaxial reactors available from ASM International based in Bilthoven, The Netherlands.

Dislocation defects 150 in the second crystalline semiconductor material 140 reach and terminate at the sidewalls of the opening 120 in the dielectric layer 110 at or below the vertical predetermined distance H from the surface of the substrate, such that dislocations in the second crystalline semiconductor material 140 decrease in density with increasing distance from the bottom portion of the opening 120. Accordingly, the bottom portion of the second crystalline semiconductor material 140 comprises lattice defects, and the upper portion of the crystalline material is substantially exhausted of crystalline defects. Various crystalline defects such as threading dislocations, stacking faults, twin boundaries, or anti-phase boundaries may thus be substantially eliminated from the upper portion of the crystalline material.

One possible origin of the threading dislocations in Ge epitaxial layers grown on Si substrates is the glide and expansion of dislocation half-loops formed during the mismatch relaxation process. In general, dislocations of this type are referred to herein as "slip dislocations." These are glissile dislocations that can glide in response to epitaxial layer strain. For a crystalline semiconductor with a cubic structure, such as Si, Ge, GaAs, InP, etc., a common dislocation of this type that occurs during mismatched epitaxy is the 60° dislocation (where 60° is the angle between the dislocation line and the dislocation Burgers vector) located on {111} glide planes. FIG. 1 illustrates trapping of such glissile threading dislocations, which are typically oriented along <110> crystalline directions. Thus, when the dislocation is directed toward a substantially vertical sidewall oriented in a <100> direction, as shown in FIG. 1, it will be trapped at a sidewall within a vertical distance from the substrate H=w*tan(45°), where 45° is the angle between the dislocation and the substrate. For other sidewall orientations, the requirement for H is slightly less straightforward; this may be understood from FIG. 2 as follows.

Figure 2:
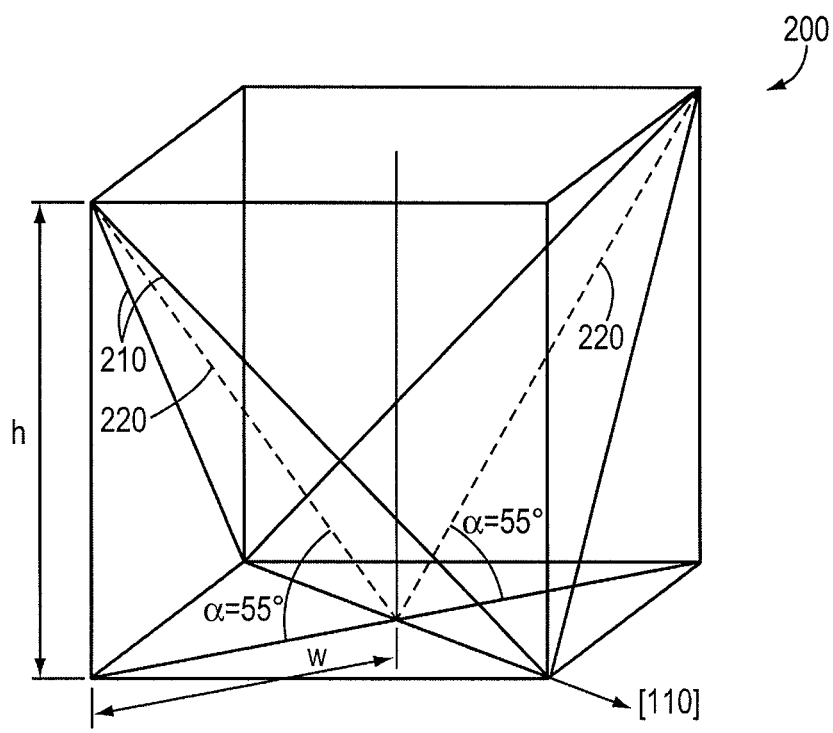
FIG. 2 is a schematic diagram showing the crystallography of mismatch relaxation related glissile threading dislocations and their projections onto (110) plane (w is the width of the opening while h is the height of the sidewall)

FIG. 2 shows directions in a cubic crystal 200, indicating the expected possible line directions of 60° threading dislocations (thick lines 210) and their projections onto the (110) plane (long dashed lines 220) where w and h indicate the height and width of the opening. Their projections onto the (110) plane form ~55° angles with the [1$\bar{1}$0] direction. Therefore, for an opening 120 with an aspect ratio larger than h/w=tan 55°, and with substantially vertical sidewalls oriented in a <110> direction, such glissile threads may be trapped solely due to their crystallographic geometry, i.e., solely due to their preferred orientation after experiencing glide.

However, in an embodiment with a Si (100) substrate, threading dislocations with line direction along approximately the [001] growth direction may be created during growth. These threading dislocations will not necessarily be trapped merely by appropriate choice of sidewall orientation and sidewall height. This behavior may be understood in view of the concept of "growth dislocations," which are distinguished here from slip dislocations. Growth dislocations are connected with the growth front and proceed with it via replication during growth. The line direction of a growth dislocation is a function of its Burgers vector and the crystal growth direction, and is generally approximately normal (usually within ~10°, e.g., no more than about 8° off normal) to the growth face, i.e., epitaxial film surface, that the dislocation intersects; growth dislocations are assumed not to experience significant glide. This behavior is distinct from that of slip dislocations, which experience significant glide during relaxation of mismatched strain.

Figure 3:
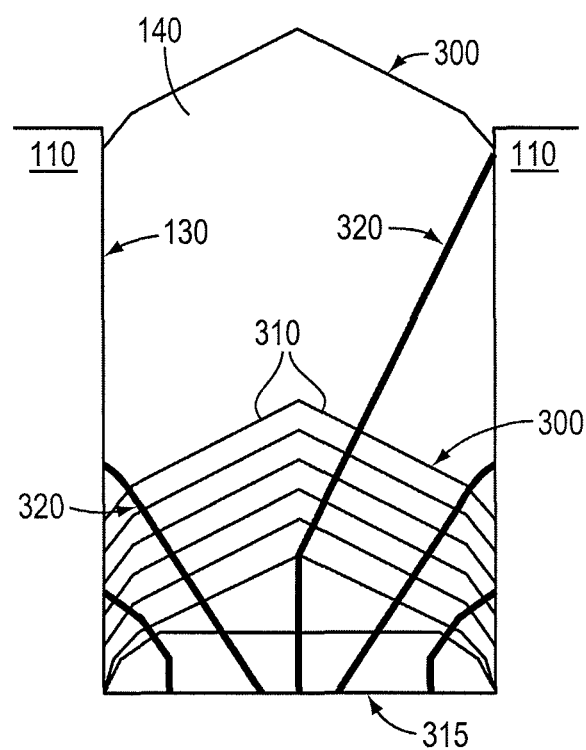
FIG. 3 is a schematic diagram illustrating redirection of dislocations in accordance with an aspect of the invention.

Methods for trapping this type of threading dislocation are disclosed below. As shown in FIG. 3, a growth surface 300 (also referred to herein as a growth front) of an epitaxial film of the second crystalline semiconductor material 140 grown in the opening in dielectric material 110 may tend to form facets 310 before the sidewall is fully covered by the epitaxial film. "Facet" is used herein to denote any surface of the epitaxial material that is not parallel to an underlying substrate surface 315. Whether or not facets form, and what crystal planes the facets comprise if they do form, depends upon various parameters, e.g., material grown, epitaxial process conditions such as pressure and temperature, sidewall dielectric material, and sidewall dielectric profile. These epitaxial film-formation parameters may be configured to cause facet formation. Thus, a profile of a top surface of the second crystalline semiconductor material 140 (i.e., the growth surface 300) may be configured to direct defects towards the sidewall 130.

Figure 4A:
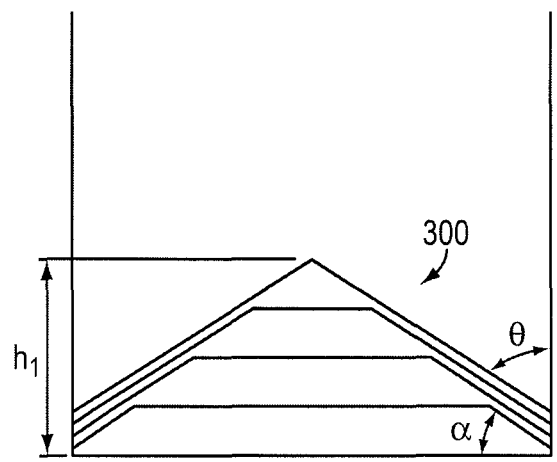
FIGS. 4a and 4b are graphs illustrating the effect of growth rate ratios on facet formation.

As mentioned above, during crystal growth, a growth dislocation 320 is typically oriented approximately normal, i.e., generally perpendicular, to the growth surface 300 that the dislocation intersects. The growth surface geometry may evolve during growth because of differences in growth rates along different crystallographic directions. A given growth surface may increase in area at the expense of an adjacent growth surface, as illustrated conceptually in FIGS. 4a and 4b. One may define two growth rates $r_1$ and $r_2$, where $r_1$ is the growth rate of the epitaxial surface parallel to the underlying substrate and $r_2$ is the growth rate of the faceted epitaxial surface. In FIG. 4a, the ratio $r_1/r_2$ is high, leading to a smaller value of $h_1$, whereas in FIG. 4b, the ratio $r_1/r_2$ is low, leading to a larger $h_1$, where $h_1$ is the distance from the opening bottom to the point at which the facets fully consume the central growth surface.

Figure 4B:
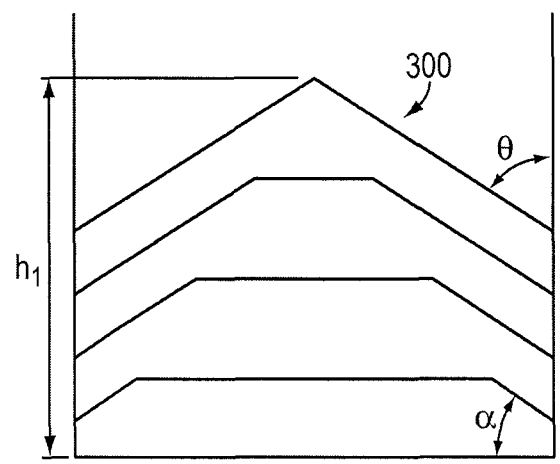

A growth dislocation will typically experience redirection when the orientation of the surface it intersects changes. In other words, since a growth dislocation is typically replicated in a direction normal to the growth surface during epitaxy, if the growth surface orientation changes, the growth dislocation direction will also change. In the absence of faceting, if the growth surface is parallel to the substrate surface, growth dislocations will typically be oriented approximately perpendicular to the substrate. This means that they may not be trapped by substantially vertical sidewalls, regardless of the opening's aspect ratio. When faceting is present, the facets are typically initiated at the beginning of epitaxial growth at the edges of the opening; they progressively "consume" more and more of the growth surface as shown in FIGS. 4a and 4b. This leads to redirection of growth dislocations away from the opening center and toward the opening sidewalls, leading to dislocation trapping. This behavior has been observed experimentally by using SiGe marker layers to indicate facet evolution during growth of Ge in an opening in $SiO_2$ on a Si (100) surface. Clearly, faceting can greatly increase the effectiveness of aspect ratio trapping.

More specifically, the following experimental conditions were used to engineer facets to effectively direct growth dislocation segments to the sidewalls. Starting with a Si (001) substrate having a 500 nm-thick thermal oxide overlayer patterned with vertical sidewall openings 200 nm wide and larger, oriented along the [110] direction, Ge layers were grown using a two-step process including growth of a low-temperature buffer layer at 400° C. and growth of a second layer at a higher temperature of 600° C. For the purpose of delineating facet evolution, SiGe marker layers of approximately 10%-15% Si content were periodically inserted. This step is not required for the ART technique, but was done merely for the purposes of elucidating the process. For analysis, cross-sectional and plan-view transmission electron microscopy (TEM) specimens were prepared by mechanical thinning followed by Ar ion-milling. TEM analysis was conducted on a JEOL JEM 2100 microscope.

The threading dislocations revealed in samples prepared under these experimental conditions cannot be "slip dislocations" as the term is used herein. The dominant slip dislocation expected to occur in this material system is the 60° threading dislocation discussed above, typically oriented along a <110> direction. The projection of such a dislocation onto the (110) TEM specimen plane would form a 55° angle with the substrate (as can be understood from FIG. 2), regardless of the growth surface orientation. Contrary to this expected behavior of a slip dislocation, the threading dislocation segments observed in these samples appear to approximately follow directions normal to the growth surface (within around 8°), and often have an angle relative to the substrate that is not substantially equal to 55°. Most significantly, if a threading dislocation segment subsequently encounters a growth surface of a different orientation, it undergoes significant redirection to follow the direction normal to this latter surface. Clearly these configurations are not the result of lattice mismatch-driven half-loop expansion.

A sample was thinned from the substrate side down to a thickness of ~200 nm; both the Si substrate and the first ~300 nm of the epitaxial layer (where the defect trapping occurred) were removed, leaving only a defect-free Ge layer. TEM analysis of the quality of the Ge layer showed the effectiveness of the ART technique and using facet growth to direct growth of dislocations so that they are trapped within the ART region.

Figure 5A:
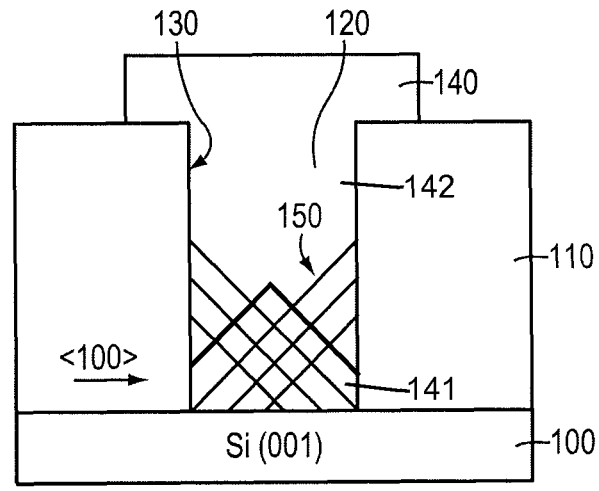
FIGS. 5a and 5b are schematic diagrams illustrating defect trapping.
Figure 5B:
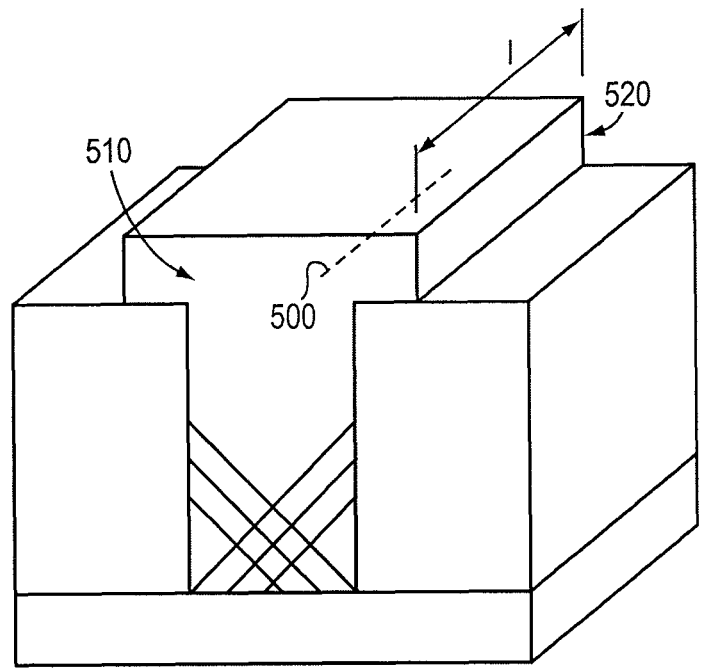

Referring also to FIGS. 5a and 5b, further experiments demonstrated effective trapping of threading dislocations in trenches of arbitrary length. These experiments began with substrate 100 including a first semiconductor material, i.e., 200 mm diameter p-type Si (001) substrates, 6° off-cut along the [110] direction and dielectric layer 110 disposed thereover, i.e., a 500 nm-thick thermal oxide. The dielectric material was patterned to define openings 120 configured as trenches along the [1$\bar{1}$0] direction having 0.2-2.5 µm width using conventional photolithography and RIE. The trenches include a longitudinal axis 500. The trenches also include first and second faces 510, 520, with the longitudinal axis intersecting the first and second faces 510, 520.

RIE with $CF_x$ chemistries can leave a fluorocarbon residue on the surface, causing defective epitaxial layers in subsequent growth. To remove this residue in preparation for epitaxial growth, an oxygen plasma ashing step (800 W at 1.2 Torr for 30 minutes) was carried out after RIE. The patterned substrates were then cleaned in Piranha, SC2, and dilute HF solutions sequentially. The final trench height (i.e., depth) was 490 nm after this cleaning procedure.

The trenches were filled with second crystalline semiconductor material 140 having a lattice mismatch with the first semiconductor material. In particular, the second crystalline semiconductor material was deposited in 450 nm-thick Ge layers, comprising a first layer 141 (e.g., a low-temperature buffer layer) and a second layer 142 (e.g., a higher-temperature growth layer), which were grown at 400 and 600° C., respectively, using an ASM Epsilon E2000 commercial-grade epitaxy reactor. Cross-sectional and plan-view TEM samples were prepared by mechanical polishing and Ar ion milling. TEM images were taken on a JEOL JEM 2100 microscope operating at 200 kV. Cross-sectional TEM images of Ge layers in trenches of 200 nm width and 400 nm width were prepared. These structures have ARs of 2.45 and 1.23, respectively. In the first sample, it was seen that the dislocations originating at the Ge/Si interface terminate at the oxide sidewall 130 below 200 nm and that complete trapping occurred within the first 200 nm of Ge growth. Furthermore, there was no evidence of either defect generation along the $SiO_2$ sidewall or of interactions within the trench causing defects to deflect and zigzag out of the trench. Defects, e.g., threading dislocations 150 arising from the lattice mismatch between the first and second semiconductor materials, propagated away from a longitudinal axis 500 of the trench in a direction substantially perpendicular to a growth front of the second material and were trapped by a sidewall of the trench. As a result, a completely defect-free region was created as the growth proceeded beyond the defect-trapping region. Moreover, substantially no defects intersect the first and second faces 510, 520. Here, a defect-free region of about 300 nm in thickness was demonstrated. Similarly, for the 400 nm-width structure, the defect-trapping region was about 400 nm thick. The final thickness of the defect-free region was about 100 nm. A trench suitable for fabrication in accordance with embodiments of the invention may have a length 1 of at least 6 mm, a width of less than 400 nm and/or a depth of less than 490 nm.

The mechanism of ART was further illustrated with plan-view TEM images of Ge layers in trenches of 360 nm width and 700 nm width. The AR was 1.36 and 0.7, respectively. Here the TEM captured the entire thickness of the Ge-filled trenches. It was found that the dislocations in Ge area terminate at the oxide sidewall. For AR>1, most of the dislocations were trapped by the oxide sidewall, which is not the case with AR<1. For this latter case many dislocations terminate at the $SiO_2$ sidewall, but some terminate instead at the Ge surface.

Trapping for AR>1 has previously been predicted based on the preferred defect geometry in the <110>{111} diamond cubic slip system. For growth on an (001) surface of substrate 100, misfit segments lie at the heteroepitaxial interface along <110> directions, with the threading segment rising up on (111) planes in <011> directions, making a 45° angle to the underlying Si (001) substrate 100 as shown in FIG. 5. Thus, for AR>1 threading dislocations will be trapped by a (100)-oriented sidewall of the epitaxial material, leading to a defect-free top epitaxial layer on Si.

In order to definitively demonstrate regions of defect-free Ge by ART, the TEM sample used for generation of plan views of Ge layer in trenches of 360 nm width and 700 nm width was thinned further, removing the dislocation-trapping region and imaging the overlying defect-free region. As is typical with a plan-view TEM sample preparation technique, a wedge-shaped sample was created. Convergent beam diffraction patterns were used to measure the thickness at the center of the sample. This was found to be about 70 nm. For trenches with a width of 290 nm, multiple adjacent trenches were completely dislocation-free except for one defect in the thickest part of the sample where the sample begins to encroach on the underlying trapping region. This is consistent with the cross-section TEM results, assuming the thickness of the heavily dislocated region to be approximately equal to the width of the trench.

These results offer a compelling new path for adding new semiconducting materials to the Si CMOS technology platform. Only conventional tools and techniques, in common use in Si CMOS manufacturing, were used to fabricate these samples. Furthermore, the thermal budget was low enough such that the Ge (or other materials such as II-VI or III-V compounds) could be added at any time in a CMOS process. Given the growing interest in replacing Si in the CMOS channel with Ge (for PMOS) and eventually with III-V materials (for NMOS), it is worth noting that the feature size achieved (400 nm with full trapping) is already large enough to serve as the active area for leading-edge CMOS logic transistors, assuming, as an example, a single planarized ART region per transistor.

In summary, regions of Ge up to 400 nm wide and free of near-surface defects were demonstrated via ART in $SiO_2$ trenches on Si using conventional photolithography and selective growth of Ge layers as thin as 450 nm. All of the dislocations originating at the Ge/Si interface were trapped at the oxide sidewall without the additional formation of defects at the sidewall for trenches having AR>1. By removing the dislocation-trapping region in plan-view TEM sample preparation, it is possible to obtain defect-free Ge. This approach utilized standard commercial equipment for all parts of the fabrication process and demonstrates a commercially viable way to integrate Ge and III-V materials as well with Si CMOS technology. Transistors and/or opto-electronic devices may be formed, which in some embodiments include at least a portion of the second semiconductor material formed in trenches defined in dielectric materials.

Growth dislocations may either be created at the substrate/epitaxial layer interface (for example, to accommodate local nonuniformity or disregistry) or by replication of pre-existing threading dislocations that intersect the growth front. These pre-existing threading dislocations may, for example, be segments of glissile dislocation loops that glide from the growth surface to the substrate/epitaxial layer interface under the influence of lattice-mismatch stress during the earlier stages of growth. Thus, it is possible for a single dislocation line to have both a slip dislocation segment and a growth dislocation segment.

Figure 6:
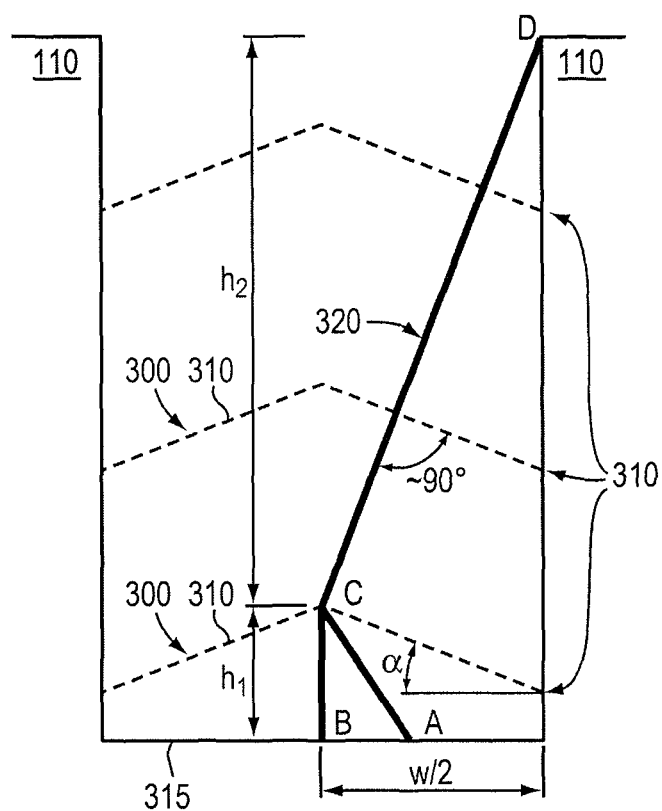
FIG. 6 is an illustration of a simple model for aspect ratio trapping of growth dislocations.

Based on the observed behavior, it is possible to calculate the critical aspect ratio for growth-dislocation trapping under certain simplifying assumptions. FIG. 6 depicts a model for the case of a single type of non-{100} facet nucleating immediately upon initiation of growth at the pattern edges, and assuming dislocation 320 orientation perfectly normal to the local growth surfaces 300. Here, w is the width of the opening, and a is the angle between the substrate surface 315 and the dominant growth facet 310. The non-{100} facets grow and eventually consume the (001) central surface as discussed with respect to FIGS. 4a and 4b, assuming growth rate $r_1$ of the (001) surface is higher than growth rate $r_2$ of the non-{100} facet. $h_1$ is the distance from the opening bottom to the point at which the non-{100} facet fully consume the (001) growth surface; $h_2$ is the height that it takes for a dislocation 320 bent at the critical point C to be trapped by the sidewall. $h_1$ is determined by a and the ratio of the growth rate of the non-{100} facet to that of the (001) surface, $r_2/r_1$; $h_2$ depends only on α. The expressions for these are:

$$h_1 = \left(\frac{w}{2}\right)\left(\frac{\tan\alpha}{1 - \frac{r_2}{r_1 \cos\alpha}}\right), \quad (Eq. 1)$$

$$h_2 = (w\cot\alpha)/2. \quad (Eq. 2)$$

Note that for the case of $r_1 \gg r_2$, a situation that was approximated in experiments as evidenced by the far greater spacing between marker layers in the (001) direction, this simplifies to $h_1 = (w \tan \alpha)/2$. Two dislocations ACD and BCD are used to illustrate the model. For dislocation ACD, segment AC is of glissile nature and is created during the relaxation of mismatch stress, early in the epitaxial growth process. During subsequent growth, instead of simply continuing in its original orientation, it is redirected in the direction normal to the growth surface it encounters, i.e. the non-{100} facet. The aspect ratio required for trapping of ACD is $(h_1+h_2)/w$. Dislocation BCD is an example of the redirection and trapping of an existing growth dislocation below point C (segment BC is of growth nature and oriented approximately along the [001] growth direction). Again, the aspect ratio for successful trapping is $(h_1+h_2)/w$. For either case, the existing threading dislocations below point C may be deflected from the middle to either side (depending on the exact location of the original dislocation) regardless of their original directions and nature.

To summarize, an important factor influencing the direction of threading dislocations toward the dielectric sidewalls in ART, for the case of facets forming early in the growth process, is the influence of growth facets causing threading dislocations to replicate approximately along the local facet normal, hence directing them to the sidewalls. However, it should be noted that, if mismatch generates glissile threading segments (i.e., "slip dislocations") in the later stages of growth, these segments are not likely to have the opportunity to be converted to growth dislocations; therefore, the preferred crystallographic geometry of such slip dislocations, as discussed previously, will play the dominant role in their trapping.

Figure 7:
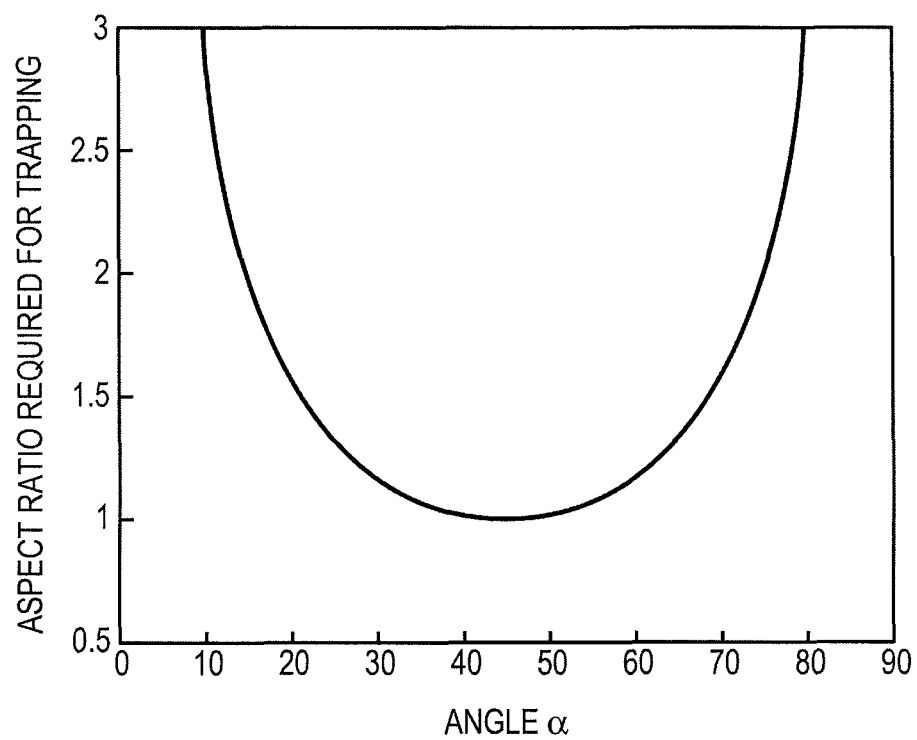
FIG. 7 is a graphical representation illustrating a preferred aspect ratio for a given angle α between a facet and a top surface of the substrate, under the simplifying assumptions of $r_1 \gg r_2$, where $r_1$ and $r_2$ are the growth rates of (1) the epitaxial surface parallel to the underlying substrate and (2) the growth rate of the faceted epitaxial surface, respectively.

Structures may be designed to encourage faceting to increase the efficacy of dislocation trapping and reduce the required height of opening sidewalls. Formation of facets that have a high inclined angle with respect to the sidewall at an early stage of growth is highly desired. This can clearly be understood from the simple model that applies for the case of $r_1 \gg r_2$ as discussed above, where the preferred aspect ratio for growth dislocation trapping is $(h_1+h_2)/w = (\tan\alpha+\cot\alpha)/2$. For a given w, this aspect ratio is minimized for α=45°. FIG. 7 depicts graphically the aspect ratio preferred for trapping growth dislocations based on redirection via faceting, as predicted by this simple model for the case of $r_1 \gg r_2$.

Epitaxial film-formation parameters may be configured to cause the formation of a facet, i.e., to enhance facet formation. Examples of film-formation parameters that may be configured include:

(1) Selection of a sidewall dielectric material so that the system has a high interface free energy between the dielectric material and the second crystalline semiconductor material to be deposited in the opening;

(2) Design of the geometry of the dielectric sidewall;

(3) Engineering of the epitaxial growth conditions, for example, growth temperature;

(4) Choosing the orientation of the dielectric sidewall relative to a given crystallographic direction; and (5) Choosing the doping condition of the epitaxially deposited semiconductor material.

Figure 8A:
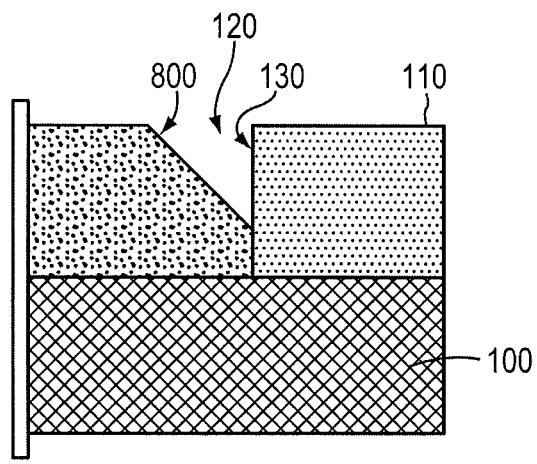
FIGS. 8a-8b are schematic diagrams illustrating facet dependence upon dielectric sidewall material.
Figure 8B:
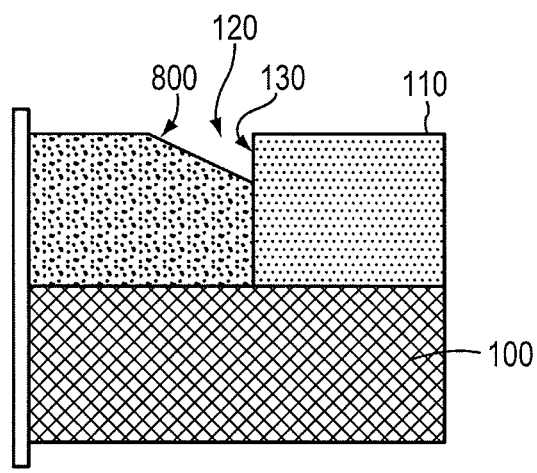

As shown in FIGS. 8a-8b, the dielectric material of the dielectric layer 110 in which the opening 120 is defined may be selected to enhance facet formation and defect trapping. For example, by employing a dielectric material with a relatively high interface free energy between the dielectric material and the epitaxial material to be grown in the opening, i.e., the second crystalline semiconductor material, facets 800 with a high inclination angle with respect to the sidewall may be introduced and hence improve the trapping efficacy of dislocations. For example, referring to FIG. 8a, silicon nitride may be used as a dielectric layer 110 to encourage formation of steep facets 800. An exemplary process includes deposition of a silicon nitride layer, with a preferred thickness ranging from 20 nm to 5 μm, on a substrate, e.g., a (100) Si substrate. The silicon nitride layer may be deposited at 780° C. by any LPCVD technique. A photoresist layer is formed to define openings, and the silicon nitride material in these openings is removed, for example by means of an RIE that stops selectively on the Si surface. Then a selective epitaxial layer of a second crystalline semiconductor material, such as Ge, at a temperature of 585° C., is deposited in these openings by, for example, MOCVD. The epitaxial material deposited in this structure with silicon nitride sidewalls 130 is expected to form (111) facets on the edges next to the sidewalls 130.

In comparison, using silicon dioxide as the dielectric material 110 for the sidewalls, as shown in FIG. 8b, can result in a lower inclination angle of the facets 800 in comparison to silicon nitride material 110 for the sidewalls 130.

Experimental results demonstrated different faceting behavior between the selective epitaxial layer of Si grown on Si substrate in a silicon nitride opening and that grown in a silicon oxide opening. The selective Si epitaxial layer tends to form {311} facets adjacent to silicon oxide sidewalls, while it tends to form {111} facets adjacent to silicon nitride sidewalls. In this example, a {111} facet has a higher inclined angle with respect to the sidewall than does a {311} facet. Although this experiment was performed with Si epitaxial growth, similar behavior can be expected for selective epitaxial growth of other materials, such as Ge and III-V materials.

Figure 9A:
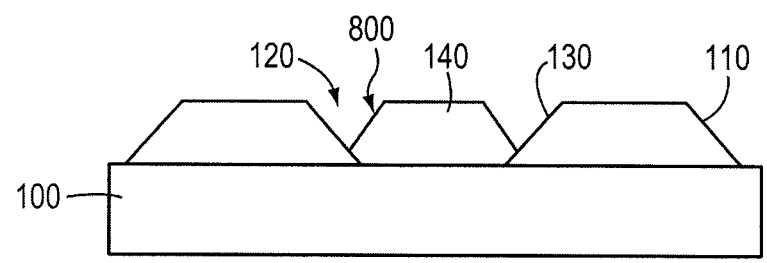
FIGS. 9a-9b are schematic diagrams illustrating facet dependence upon dielectric sidewall profile.
Figure 9B:
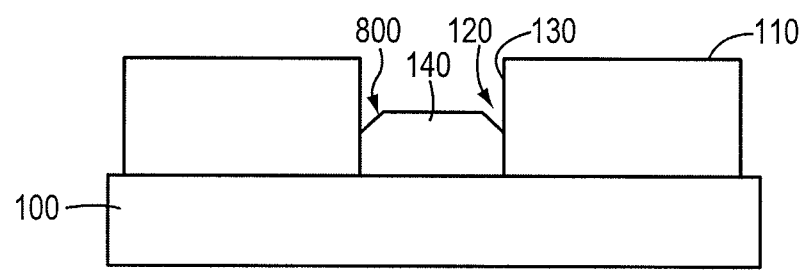

In another embodiment, with reference to FIG. 9a-9b, the geometry of the dielectric sidewall 130 that bounds the opening 120 is selected to encourage the formation of facets 800. More specifically, a gradually sloped dielectric sidewall is more likely to encourage steeply inclined facet formation than a substantially vertical dielectric sidewall. FIG. 9a shows such a dielectric sidewall 130 with a gradually sloped profile. In contrast to the dielectric with vertical sidewall as shown in FIG. 9b, such a gradually sloped profile tends to encourage the formation of steep facets 800. Gradually sloped sidewalls can be obtained in a variety of ways, including, for example, sidewalls with a slope of about 25 to 40 degrees off vertical by wet etching or sidewalls with a slope of about 6 to 12 degrees off vertical by dry etching.

The strong dependence of faceting of a lattice-matched material on sidewall profile has been demonstrated in the literature. For example, R. Loo, et al., *J. Elec. Soc.* 150 (10), G638 (2003) show two samples of lattice-matched Si epitaxial layers selectively grown on a Si substrates in openings bounded by silicon nitride dielectric sidewalls. Experimental results indicate that the deposited epitaxial layer tends to form {111} facets at a gradually sloped sidewall and {311} facets at a vertical sidewall. Since the {111} facet has a higher inclined angle with respect to the substrate surface than does the {311} facet, the case of a sloped dielectric sidewall geometry can be a preferred condition for dislocation trapping. Embodiments of the present invention include selective epitaxial growth of lattice-mismatched materials, such as Ge and III-V materials on Si substrates, with sidewall profiles engineered to cause formation of facets in the epitaxially grown material.

Figure 10A:
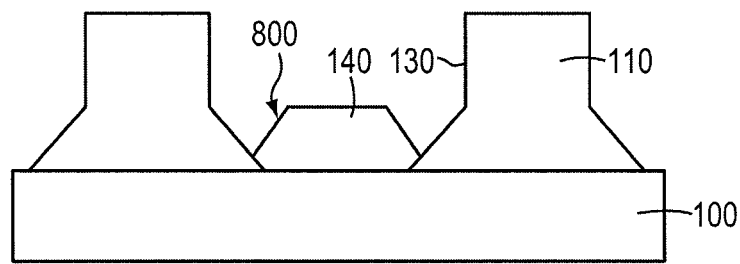
FIG. 10a-10b is a schematic diagram of a structure designed to promote steep facets and more effective ART.
Figure 10B:
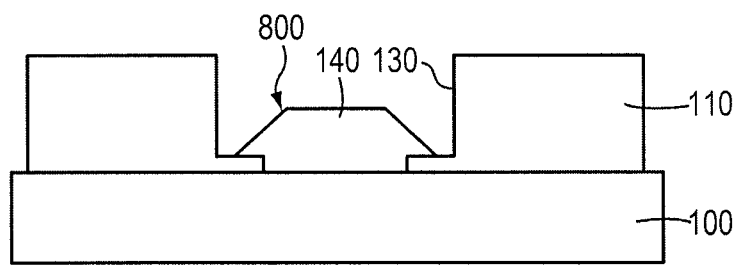

Without a substantially vertical sidewall, a greater height/width aspect ratio may be required to trap dislocations. To solve this conflicting design criterion for the sidewall profile, a dielectric sidewall 130 with a gradually sloped bottom portion and a substantially vertical top portion may be used, as illustrated in FIG. 10a. As described above, the gradually sloped bottom portion may introduce desirable, steeply inclined faceting at the early stage of the growth and enhance the dislocation trapping efficacy; the substantially vertical top portion is preferred for effectively trapping the defects that have been redirected. An alternative embodiment that is expected to have the same effect is shown in FIG. 10b, in which the bottom portion of the dielectric sidewall 130 defines a step.

Growth conditions for the lattice-mismatched epitaxial layer may be designed to encourage defect trapping by faceting. Epitaxial layer growth conditions, such as growth temperature, may significantly affect faceting. For example, a low epitaxial growth temperature, such as ~450-550° C. for selective Ge epitaxial growth on Si substrate, may be chosen to encourage the epitaxial layer to form a steeper facet, i.e., a facet with higher inclination angle with respect to the sidewall. The strong dependence of faceting of lattice-matched materials on growth temperature has been demonstrated in the literature. For example, S. Lim, et al., *J. Vac. Sci. Technol.* B 22(2), 682 (2004), show several samples of a selective silicon epitaxial layer grown on a Si substrate in openings bound by silicon dioxide. Images taken from samples grown at temperatures of 550° C., 600° C. and 650° C. in sequence show that the growth conditions affect faceting. The (111) facet tends to form at the early growth stage at lower growth temperature, while the (211) facet forms at higher growth temperature. Again, since the angle between the (111) facet and the substrate is larger than that of the (211) facet, the dislocations are trapped more effectively in the former case. Embodiments of the present invention include selective epitaxial growth of lattice-mismatched materials, such as Ge and III-V materials on Si substrates, with facets being formed by the engineering of growth conditions such as growth temperature. Thus, dislocations may be trapped more effectively by desirable faceting.

Although a more steeply inclined facet is generally superior for growth dislocation trapping, in practice the steepest desirable inclination is about 45° in most circumstances. This is clear from the simplified model as described with respect to FIG. 7. For epitaxy of cubic semiconductors grown adjacent to dielectric sidewalls, facets steeper than 45° are not typically encountered.

Figure 11A:
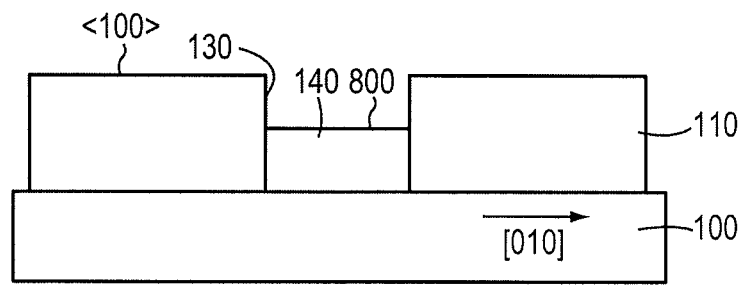
FIGS. 11a-11b are schematic diagrams-illustrating facet dependence upon dielectric sidewall orientation.
Figure 11B:
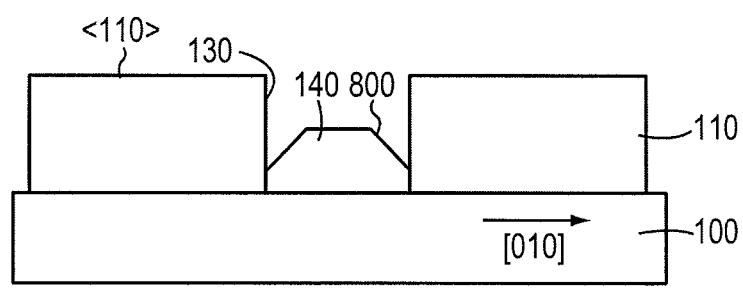

Referring to FIGS. 11a-11b, the orientation of the dielectric sidewalls 130 bounding the opening may influence the faceting of the selectively grown epitaxial layer 140. Therefore, the geometric pattern of the dielectric layer 110 may be designed to enhance the desirable faceting and hence improve the efficacy of dislocation trapping. For example, for selectively grown lattice-mismatched epitaxial layers, such a Ge, on a substrate 100 (e.g., {100} Si), growth may be substantially facet-free when the dielectric sidewalls 130 are oriented in <100> directions (shown in FIG. 11a). In comparison, epitaxial growth adjacent to dielectric sidewalls oriented in <110> directions will typically introduce facets (shown in FIG. 11b). Therefore, a dielectric sidewall oriented in a <110> direction is expected to lead to greater efficiency in trapping growth dislocations than a dielectric sidewall oriented in a <100> direction.

Figure 12A:
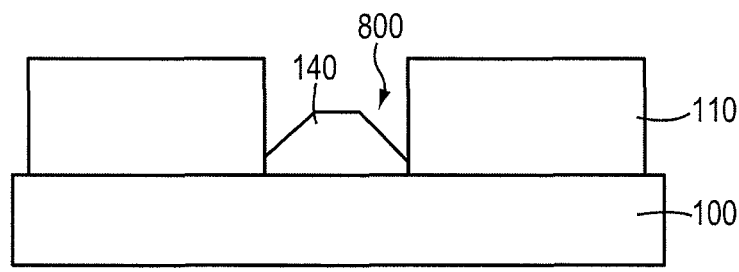
FIGS. 12a-12b are schematic diagrams-illustrating facet dependence upon epitaxial doping type.
Figure 12B:
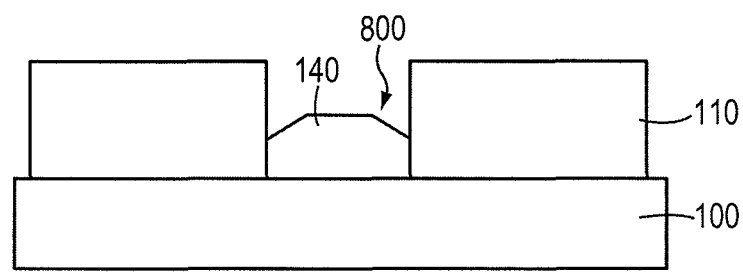

In another embodiment, as illustrated in FIGS. 12a-12b, the doping of the selectively grown epitaxial material 140 may be engineered to enhance facets 800 with steeper inclination angles, thereby improving the defect trapping. For example, when an epitaxial layer is doped to improve the conductivity of the semiconductor material, the choice of dopants may affect the angle of facet inclination. A steep facet 800 may form during Si growth if a first dopant, e.g., boron is incorporated (FIG. 12a), while a gradually sloped facet 800 may form if a second dopant, e.g., arsenic, is incorporated (FIG. 12b). The steeper facet formed in the former case is more effective in dislocation trapping than the gradually sloped facet formed in the latter case. Varying doping conditions in the epitaxial layer leads to different facet geometry and inclination angle.

Figure 13:
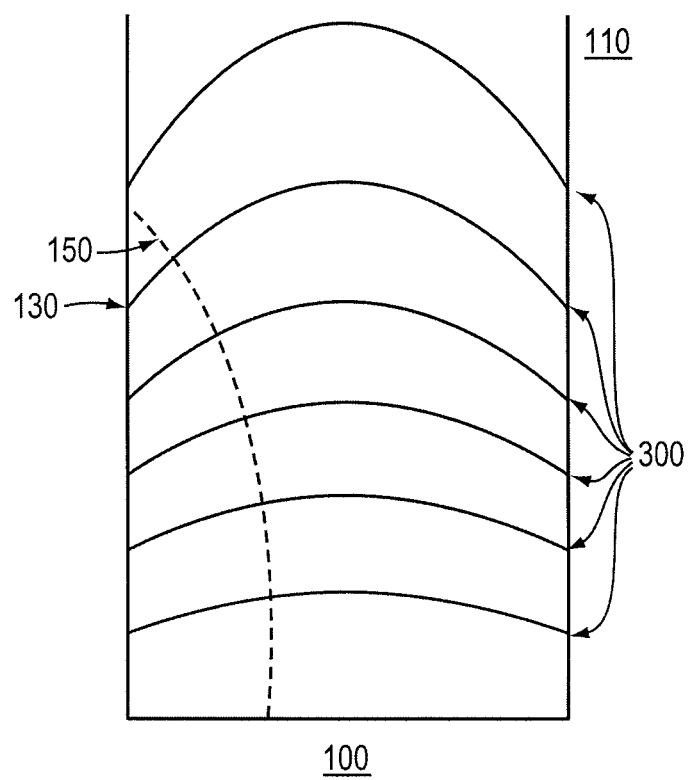
FIG. 13 is a schematic diagram illustrating defect redirection toward a dielectric sidewall for the case of a curved and non-faceted surface.

In another embodiment, with reference to FIG. 13, dislocations 150 may be guided even without the creation of facets. For the case of a curved growth surface, the growth dislocations will be guided to the sidewalls 130 in the case of convex curvature (i.e., thicker toward the middle of the opening, thinner at the edges), as illustrated in FIG. 13. A concave growth surface (thicker toward the edges and thinner at the middle) is preferably avoided, as this may guide dislocations to the center of the opening. A curved growth surface may occur under certain doping condition and sidewall orientations, for example, Si epitaxial material formed in openings bound by silicon dioxide sidewalls oriented in <100> directions, and in-situ doped with arsenic.

Figure 14A:
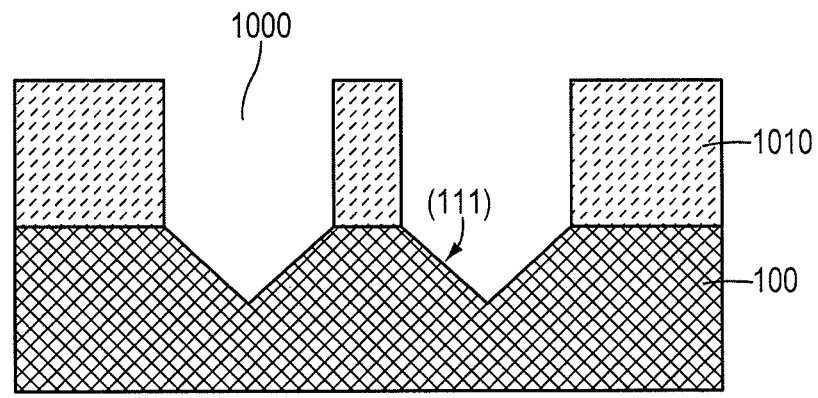
FIGS. 14a-14d are schematic cross-sectional views illustrating a structure including faceted openings defined in a substrate, formed in accordance with an embodiment of the invention.

In yet another embodiment, facets defined in the substrate, prior to epitaxial growth, may be used to promote trapping of defects. As illustrated in FIG. 14a, a mask opening 1000 is defined in a photoresist layer 1010 formed over a top surface of substrate 100. A selective etch is performed to expose a specific crystal plane of the substrate in a bottom portion of the opening 1000. For example, a wet KOH etch may used to expose a (111) Si surface. The photoresist layer is subsequently removed.

Figure 14B:
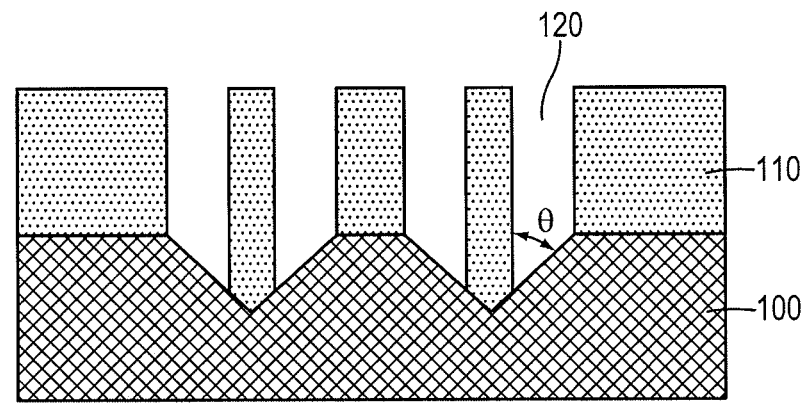

Referring to FIG. 14b, dielectric layer 110 is defined over the substrate 100 (including a first semiconductor material as described above), and opening 120 is defined in the dielectric layer 110. The opening 120 may be defined by a selective removal process such as RIE, stopping at the top surface of the substrate 100 to reveal the exposed crystal plane. The opening sidewall defines an angle θ with the substrate 100, with the angle θ preferably being less than 90°.

Figure 14C:
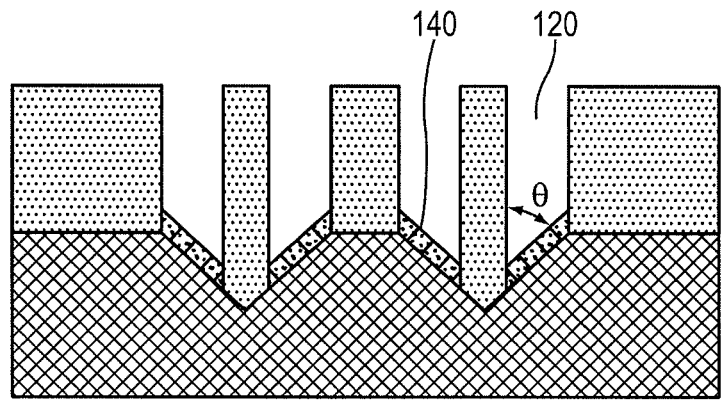

Referring to FIG. 14c, second semiconductor material 140 is formed in the opening 120 by selective epitaxy. The initial epitaxial surface will form at approximately the same angle θ with the opening sidewall, such that dislocations lying in a plane approximately normal to the epitaxial surface will be redirected to the opening sidewall.

Figure 14D:
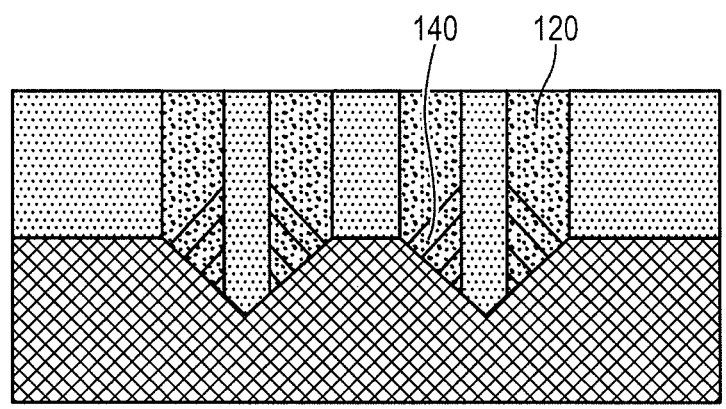

Referring to FIG. 14d, the opening 120 is filled with the second semiconductor material 140. Chemical-mechanical polishing (CMP) may be used to planarize a top surface of the epitaxial second semiconductor material. The low-defect epitaxial area may be used for subsequent device fabrication.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A structure comprising:
 a substrate comprising a first semiconductor material;
 an insulator layer disposed over a top surface of the substrate and defining a trench having a sidewall; and
 a second semiconductor material disposed in the trench, the second semiconductor material being lattice mismatched to the first semiconductor material, wherein a portion of the second semiconductor material comprises lattice defects, each of the defects having a first portion and a second portion, the first portion being in a first direction, the second portion being in a second direction different from the first direction and non-parallel to the top surface, the second portions of the defects terminating in the respective second directions at the sidewall, the respective second directions each defining an angle α with the sidewall, the angle being 45° or less.

2. The structure of claim 1, the insulator layer having a height in a third direction normal to the top surface of the substrate, the trench having a length in a fourth direction parallel to the top surface of the substrate, the length being greater than the height.

3. The structure of claim 1, the insulator layer having a height in a third direction normal to the top surface of the substrate, the trench having a width in a fourth direction parallel to the top surface of the substrate, the width being equal to or less than twice the height.

4. The structure of claim 1, the trench having a length in a third direction parallel to the top surface of the substrate, the trench having a width in a fourth direction parallel to the top surface of the substrate, the length being at least twice the width.

5. The structure of claim 1, wherein the sidewall is perpendicular to the top surface of the substrate, an aspect ratio of a height h of the trench to a width w of the trench being greater than or equal to (tan α+1/tan α)/2, the height h being in a third direction normal to the top surface of the substrate, and the width being in a fourth direction parallel to the top surface of the substrate.

6. The structure of claim 1, wherein the sidewall comprises a sloped sidewall portion extending in a third direction that is not perpendicular to the top surface of the substrate.

7. The structure of claim 1, wherein the trench defines a first portion of the first semiconductor material of the substrate, the first portion having a recess portion of the first semiconductor material.

8. The structure of claim 1, wherein the trench defines a first portion of the first semiconductor material with a slanted semiconductor surface, the slanted semiconductor surface not being co-planar and not being perpendicular to the top surface of the substrate.

9. A structure comprising:
a substrate comprising a first crystalline semiconductor material;
a dielectric layer disposed over the substrate, the dielectric layer having an opening to the substrate that defines a first portion of the first crystalline material; and
a second semiconductor material disposed in the opening, the second semiconductor material being lattice mismatched to the first crystalline semiconductor material, the second semiconductor material comprising a lattice defect arising from the lattice mismatch, a first portion of the defect propagating in a first direction from an interface with the first portion of the first crystalline semiconductor material, a second portion of the defect propagating in a second direction different from the first direction, the defect terminating in the second direction at a sidewall of the opening, the second direction defining an angle $\beta$ with a top surface of the substrate, the angle $\beta$ being an acute angle of 45° or greater.

10. The structure of claim 9, the dielectric layer having a height in a third direction normal to the top surface of the substrate, the opening having a length in a fourth direction parallel to the top surface of the substrate, the length being greater than the height.

11. The structure of claim 9, the dielectric layer having a height in a third direction normal to the top surface of the substrate, the opening having a width in a fourth direction parallel to the top surface of the substrate, the width being equal to or less than twice the height.

12. The structure of claim 9, the opening having a length in a third direction parallel to the top surface of the substrate, the opening having a width in a fourth direction parallel to the top surface of the substrate, the length being at least twice the width.

13. The structure of claim 9, wherein the sidewall is perpendicular to the top surface of the substrate, an angle $\alpha$ being defined as 90° minus the angle $\beta$, an aspect ratio of a height h of the opening to a width w of the opening being greater than or equal to $(\tan\alpha + 1/\tan\alpha)/2$, the height h being in a third direction normal to the top surface of the substrate, and the width being in a fourth direction parallel to the top surface of the substrate.

14. The structure of claim 9, wherein the sidewall comprises a sloped sidewall portion extending in a third direction that is not perpendicular to the top surface of the substrate.

15. The structure of claim 9, wherein the opening comprises a first width proximate the first portion of the first crystalline semiconductor material and a second width distal from the first portion of the first crystalline semiconductor material, the second width being greater than the first width.

16. A structure comprising:
a substrate comprising a first crystalline semiconductor material;
a dielectric layer disposed over the substrate, the dielectric layer having an opening to the substrate that defines a first portion of the first crystalline material; and
a second semiconductor material disposed in the opening, the second semiconductor material being lattice mismatched to the first crystalline semiconductor material, the second semiconductor material comprising lattice defects, the lattice defects propagating at least in part in a first direction non-parallel and non-perpendicular to a top surface of the substrate, the defects terminating in the first direction at a sidewall of the opening, the first direction defining an angle $\alpha$ with the sidewall, the angle being 45° or less.

17. The structure of claim 16, wherein the opening is a trench.

18. The structure of claim 16, wherein the first portion of the first crystalline semiconductor material comprises a slanted semiconductor surface recessed into the substrate.

19. The structure of claim 16, the dielectric layer having a height in a second direction normal to the top surface of the substrate, the opening having a length in a third direction parallel to the top surface of the substrate, the length being greater than the height.

20. The structure of claim 16, the opening having a length in a second direction parallel to the top surface of the substrate, the opening having a width in a third direction parallel to the top surface of the substrate, the length being at least twice the width.

* * * * *